US012670657B2

(12) United States Patent
Mccaskill et al.

(10) Patent No.: US 12,670,657 B2
(45) Date of Patent: Jun. 30, 2026

(54) METHODS AND DEVICES FOR SEAMLESS PORE NETWORK EXTRACTION

(71) Applicant: UNIVERSITY OF WYOMING, Laramie, WY (US)

(72) Inventors: Bradley Mccaskill, Laramie, WY (US); Amin Amooie, Laramie, WY (US); Mohammad Piri, Laramie, WY (US)

(73) Assignee: UNIVERSITY OF WYOMING, Laramie, WY (US)

( * ) Notice: Subject to any disclaimer, the term of this patent is extended or adjusted under 35 U.S.C. 154(b) by 166 days.

(21) Appl. No.: 18/239,180

(22) Filed: Aug. 29, 2023

(65) Prior Publication Data

US 2024/0212260 A1 Jun. 27, 2024

Related U.S. Application Data

(60) Provisional application No. 63/402,003, filed on Aug. 29, 2022.

(51) Int. Cl.
| | |
|---|---|
| *G06T 15/08* | (2011.01) |
| *G06F 30/28* | (2020.01) |
| *G06T 11/26* | (2026.01) |

(52) U.S. Cl.
CPC .............. *G06T 15/08* (2013.01); *G06F 30/28* (2020.01); *G06T 11/26* (2026.01)

(58) Field of Classification Search
CPC ......... G06T 15/08; G06T 11/206; G06T 7/11; G06T 7/62; G06T 2207/10081; G06T 2207/20044; G06T 2207/20152; G06F 30/28; G01N 15/0806; G01N 23/046; G06V 10/267; G06V 20/695; G06V 20/698; G06N 3/045
See application file for complete search history.

(56) References Cited

U.S. PATENT DOCUMENTS

| | | |
|---|---|---|
| 10,114,864 B1 | 10/2018 | Torun |
| 2004/0204857 A1 | 10/2004 | Ramamoorthy et al. |
| 2008/0208539 A1 | 8/2008 | Lee et al. |
| 2013/0259190 A1 | 10/2013 | Walls et al. |
| 2014/0019054 A1 | 1/2014 | De Prisco et al. |
| 2015/0104078 A1 | 4/2015 | Varslot et al. |
| 2015/0374028 A1 | 12/2015 | Gindrat et al. |
| 2018/0121579 A1 | 5/2018 | Fredrich et al. |

(Continued)

FOREIGN PATENT DOCUMENTS

| | | |
|---|---|---|
| CN | 112329358 A | 2/2021 |

OTHER PUBLICATIONS

Hazlett, Simulation of capillary-dominated displacements in microtomographic images of reservoir rocks, Transport in Porous Media, 20:21-35, Aug. 1995, 15 pages.

(Continued)

*Primary Examiner* — William A Beutel

(74) *Attorney, Agent, or Firm* — Patterson + Sheridan, LLP

(57) ABSTRACT

A method and device for pore network extraction by one or more processing units are disclosed. The method may include decomposing the global image into a set of overlapping subimages, extracting a set of subnetworks corresponding to the set of overlapping subimages, obtaining a cohesive pore network representing the porous media sample by merging the set of subnetworks, and outputting the cohesive pore network.

25 Claims, 15 Drawing Sheets

(56) References Cited

U.S. PATENT DOCUMENTS

| | | | |
|---|---|---|---|
| 2018/0253514 A1* | 9/2018 | Bryant | ............ G06F 30/20 |
| 2018/0321127 A1 | 11/2018 | León Carrera et al. | |
| 2019/0154597 A1 | 5/2019 | Zhang | |
| 2020/0110849 A1 | 4/2020 | Rabbani et al. | |
| 2020/0309667 A1 | 10/2020 | Nie et al. | |
| 2020/0333234 A1* | 10/2020 | Al Marzouqi | ......... G01N 33/24 |
| 2021/0208051 A1 | 7/2021 | Ju et al. | |
| 2023/0407743 A1 | 12/2023 | Shoukry et al. | |
| 2024/0070356 A1 | 2/2024 | Mccaskill et al. | |
| 2024/0070357 A1 | 2/2024 | Mccaskill et al. | |

OTHER PUBLICATIONS

Elrich, Viscous coupling in two-phase flow in porous media and its effect on relative permeabilities, Transport in Porous Media 11, Apr. 9, 1992, 18 pages.

Rabbani et al, Hybrid pore-network and lattice-boltzmann permeability modelling accelerated by machine learning, Advances in water resources 126, Feb. 26, 2019, 13 pages.

Rabbani, et al., An automated simple algorithm for realistic pore network extraction from micro-tomography images, J Pet Sci Eng, vol. 123, Aug. 12, 2014, 8 pages.

Raeesi et al., Capillary pressure hysteresis behavior of three sandstones measured with a multistep outflow-inflow apparatus, Vadose Zone Journal 13, Jun. 1, 2013, 12 pages.

Raeesi et al., The effects of wettability and trapping on relationships between interfacial area, capillary pressure and saturation in porous media: A pore-scale network modeling approach, Journal of Hydrology 376, 2009, 16 pages.

Raeesi, et al., Effect of surface roughness on wettability and displacement curvature in tubes of uniform cross-section. Colloids and Surfaces A: Physicochemical and Engineering Aspects 436, 2013, 10 pages.

Raeini, et al., Generalized network modeling: Network extraction as a coarse-scale discretization of the void space of porous media, Phys. Rev. E, 96 (2017), 17 pages.

Raeini, et al., Modelling two-phase flow in porous media at the pore scale using the volume-of-fluid method. Journal of Computational Physics 231, 2012, 16 pages.

Rücker et. al., Relationship between wetting and capillary pressure in a crude oil/brine/rock system: From nano-scale to core-scale, Journal of Colloid and Interface Science 562, Nov. 21, 2019, 11 pages.

Rusinkiewicz, Estimating curvatures and their derivatives on triangle meshes, Princeton University, 8 pages.

Ruspini, et al., Multiscale digital rock analysis for complex rocks. Transport in Porous Media, 139(2), Aug. 26, 2021, 26 pages.

Sabti, et al., In-situ investigation of the impact of spreading on matrix-fracture interactions during three-phase flow in fractured porous media. Advances in Water Resources 131, 2019, 15 pages.

Saraji, et al., Wettability of Supercritica lCarbon Dioxide/Water/ Quartz Systems: Simultaneous measurement of Contact Angle and Interfacial Tension at Reservoir Conditions, Langmuir ACS Publications, Apr. 29, 2013, 11 pages.

Scanziani et. al., Automatic method for estimation of in situ effective contact angle from x-ray micro tomography images of two-phase flow in porous media, Journal of Colloid and Interface Science 496, 2017, 9 pages.

Sedghi, et al., Atomistic Molecular Dynamics Simulations of Crude Oil/Brine Displacement in Calcite Mesopores, Langmuir, ACS Publications, Mar. 24, 2016, 10 pages.

Sedghi, et al., Molecular dynamics of wetting layer formation and forced water invasion in angular nanopores with mixed wettability, The Journal of Chemical Physics, Nov. 19, 2014, 13 pages.

Sendner et al, Interfacial Water at Hydrophobic and Hydrophilic Surfaces: Slip, Viscosity, and Diffusion. Langmuir 25, 10768-10781, Jun. 11, 2009, 14 pages.

Shabat et al., Design of porous micro-structures using curvature analysis for additive-manufacturing, Eslevier, Procedia CIRP 36, 2015, 6 pages.

Sheng, et al., A unified pore-network algorithm for dynamic two-phase flow, Advances in Water Resources 95, 2016, 17 pages.

Shi et al, Relative permeability of two-phase flow in three-dimensional porous media using the lattice Boltzmann method, International Journal of Heat and Fluid Flow 73, Aug. 4, 2018, 13 pages.

Silin et al., Pore space morphology analysis using maximal inscribed spheres, Physica A, May 16, 2006, 25 pages.

Singh et al, Dynamic modeling of drainage through three-dimensional porous materials, Chemical Engineering Science 58, Apr. 2003, 18 pages.

Siqveland et al, Derivations of the young-laplace equation, Capillarity vol. 4 No. 2, 2021, 8 pages.

Spanne et al, Synchrotron computed microtomography of porous media: topology and transports, Physical Review Letters, Oct. 3, 1994, 16 pages.

Suicmez, et al., Effects of wettability and pore-level displacement on hydrocarbon trapping, Advances in Water Resources, Nov. 19, 2007, 10 pages.

Suicmez, et al., Pore-scale Simulation of Water Alternate Gas Injection, Transport in Porous Media 66:259-286, Springer, 31, Jan. 2006, 28 pages.

Lee et al, Building skeleton models via 3-d medial surface axis thinning algorithms, CVGIP: Graphical Models and Image Processing, 56, Nov. 1994, 17 pages.

Tan et al. Equation-of-State Modeling of Associating-Fluid Phase Equilibria in Nanopores, Fluid Phase Equilibria 405, 2015, 10 pages.

Tan et al., Equation-of-State Modeling of Confined-Fluid Phase Equilibria in Nanopores, Fluid Phase Equilibria 393, 2015, 16 pages.

Thompson, Pore-scale modeling of fluid transport in disordered fibrous materials, AIChE Journal, Jul. 2002, vol. 48, No. 7, 21 pages.

Tokunaga et al, Water film flow along fracture surfaces of porous rock, Water Resources Research vol. 33 No. 6, Jun. 1997, 9 pages.

Tokunaga et. al., Transient film flow on rough fracture surfaces, Water Resources Research vol. 36 No. 7, Jun. 2000, 10 pages.

Tørå et al., A Dynamic Network Model for Two-Phase Flow in Porous Media. Transp Porous Med 92, 2012, 21 pages.

Tsang, et. al., Hydrologic issues associated with nuclear waste repositories, Water Resources Research 51, 2015, 50 pages.

Valvatne, et al., Predictive pore-scale modeling of two-phase flow in mixed wet media. Water Resources Research 40, 2004, 21 pages.

Van Genuchten, A closed-form equation for predicting the hydraulic conductivity of unsaturated soils, Soil Sci. Soc. Am. J. vol. 44, 1980, 7 pages.

Van Gorp et al, Bottom-up design of porous electrode by combining a genetic algorithm and a pore network model, Chemical Engineering Journal 455, 2023 13 pages.

Virnovsky, et al., Modeling capillary pressure using capillary bundles with arbitrary cross-sections obtained from photomicrographs. Journal of Petroleum Science and Engineering 69, 2009, 12 pages.

Vouga, Lectures In Discrete Differential Geometry 3-Discrete Surfaces, Mar. 19, 2014, 6 pages.

Wang et al., Connecting pressure-saturation and relative permeability models to fracture properties: The case of capillary-dominated flow of supercritical CO2 and brine, Water Resources Research, Sep. 27, 2018, 18 pages.

Wang et. al., Experimental study of the nonlinear flow characteristics of fluid in 3d rough-walled fractures during shear process, Rock Mechanics and Rock Engineering, Feb. 25, 2020, 25 pages.

Wang, et al., A dynamic pore-scale network model for two-phase imbibition, Journal of Natural Gas Science and Engineering 26, 2015, 12 pages.

Wang, et al., Deep learning in pore scale imaging and modeling. Earth-Science Reviews, 215, 2021, 32 pages.

Wang, et al., Fast direct flow simulation in porous media by coupling with pore network and Laplace models. Advances in Water Resources 150, 103883, 2021, 13 pages.

(56) References Cited

OTHER PUBLICATIONS

Watanabe et. al., New v-type relative permeability curves for two-phase flows through subsurface fractures, Water Resources Research, Apr. 26, 2015, 18 pages.

Welch et al., Molecular Dynamics Simulations of Retrograde Condensation in Narrow Oil-Wet Nanopores, The Journal of Physical Chemistry, 2015, 8 pages.

Welch et al., Pore diameter effects on phase behavior of a gas condensate in graphitic one- and two-dimensional nanopores, J Mol Model, 2016, 9 pages.

Wildenschild, et al., X-ray imaging and analysis techniques for quantifying pore-scale structure and processes in subsurface porous medium systems, Advanced Water Resources, vol. 51, Jan. 2013, 75 pages.

Xie, et al., Impact of connate brine chemistry on in situ wettability and oil recovery: Pore-scale experimental investigation, Energy &fuels, 2020, 15 pages.

Xiong, et al., Review of pore network modelling of porous media: Experimental characterisations, network constructions and applications to reactive transport. Journal of Contaminant Hydrology 192, Jul. 12, 2016, 17 pages.

Yan et. al., Foam sweep in fractures for enhanced oil recovery, Colloids and Surfaces A: Physicochem Eng. Aspects, Feb. 24, 2006, 12 pages.

Yang et al, An automatic in situ contact angle determination based on level set method, Water Resources Research, May 29, 2020, 14 pages.

Yang et. al., A generalized approach for estimation of in-plane curvature in invasion percolation models for drainage in fractures, Water Resources Research, vol. 48, Sep. 6, 2012, 12 pages.

Yang et. al., Effect of aperture field anisotropy on two-phase flow in rough fractures, Advances in Water Resources 132, 2019, 11 pages.

Yang et. al., Modeling immiscible two-phase flow in rough fractures from capillary to viscous fingering, Water Resources Research, 2019, 24 pages.

Ye et. al., Two-phase flow properties of a horizontal fracture: The effect of aperture distribution, Advances in Water Resources 76, 2015, 12 pages.

Yeo et. al., Effect of shear displacement on the aperture and permeability of a rock fracture, Int. J. Rock Mech. Min. Sci. vol. 35, 1998, 20 pages.

Yi, et al., Pore network extraction from pore space images of various porous media systems, Water Resources Research, Apr. 26, 2017, 22 pages.

Young, III. An essay on the cohesion of fluids, https://royalsocietypublishing.org, Dec. 20, 1804, 23 pages.

Zankoor et al., In-Situ Capillary Pressure and Wettability in Natural Porous Media: Multi-Scale Experimentation and Automated Characterization Using X-Ray Images, Journal of Colloid and Interface Science 603, Jun. 15, 2021, 14 pages.

Zankoor et. al., Supplementary Information: In-Situ Capillary Pressure and Wettability in Natural Porous Media: Multi-Scale Experimentation and Automated Characterization Using X-Ray Images, Journal of Colloid and Interface Science 603, Jun. 15, 2021, 14 pages.

Zhao, et al., Comprehensive comparison of pore-scale models for multiphase flow in porous media, Proceedings of the National Academy of Sciences vol. 116, No. 28, Jun. 21, 2019, 8 pages.

Zhao, et al., Simulation of Quasi-Static Drainage Displacement in Porous Media on Pore-Scale: Coupling Lattice Boltzmann Method and Pore Network Model. Journal of Hydrology 588, May 23, 2020, 16 pages.

Zhao, et al., The Effect of Wettability Heterogeneity on Relative Permeability of Twophase Flow in Porous Media: A Lattice Boltzmann Study. Water Resources Research 54, Feb. 27, 2018, 17 pages.

Zhou, et al., Computation of three-phase capillary entry pressures and arc menisci configurations in pore geometries from 2d rock images: a combinatorial approach. Advances in Water Resources 69, Apr. 2, 2014, 16 pages.

Zhou, et al., Dynamic capillary pressure curves from pore-scale modeling in mixed-wet-rock images. SPE Journal Aug. 2013, 12 pages.

Zhou, et al., On the Estimation of CO2 Capillary Entry Pressure: Implications on Geological CO2 Storage. International Journal of Greenhouse Gas Control, 20 pages.

Zhu, et al., Limits of the Hydrodynamic No-Slip Boundary Condition. Physical Review Letters, vol. 88, No. 10, Mar. 11, 2002, 4 pages.

Zolfaghari et al., Pore-Scale Network Modeling of Three-Phase Flow Based on Thermodynamically Consistent Threshold Capillary Pressures. I. Cusp Formation and Collapse, Transport in Porous Media, 2017, 46 pages.

Zolfaghari, et al., Pore-scale Network Modeling of Three-Phase Flow Based on Thermodynamically Consistent Threshold Capillary Pressures. I. Cusp Formation and Collapse Transport in Porous Media, Jan. 21, 2017, 46 pages.

Zolfaghari, et al., Pore-scale Network Modeling of Three-Phase Flow Based on Thermodynamically Consistent Threshold Capillary Pressures. II. Results Transport in Porous Media 116:1139-1165, Jan. 21, 2017, 27 pages.

Schroeder, et al., The Visualization Toolkit, an Object-Oriented Approach to 3D Graphics, Edition 4.1, VTK, Jul. 2018, 558 pages.

PCT/US2023/31400, International Search Report and Written Opinion dated Jan. 31, 2024, 26 pages.

PCT/US2023/31329, International Search Report and Written Opinion dated Nov. 21, 2023, 13 pages.

PCT/US2023/31338, International Search Report and Written Opinion dated Mar. 18, 2024, 22 pages.

PCT/US2024/26432, International Search Report and Written Opinion dated Aug. 22, 2024, 17 pages.

PCT/US2024/44240, International Search Report and Written Opinion dated Nov. 4, 2024, 17 pages.

Brooks et al., Hydraulic Properties of Porous Media, Hydrology Papers, Mar. 1964, 37 pages.

Leverett, et al., Capillary Behavior in Porous Solids, manuscript, Oct. 1940, 18 pages.

Li et. al., An improved method for estimating capillary pressure from 3d microtomography images and its application to the study of disconnected nonwetting phase, Science Direct, 2018, 33 pages.

Lian et. al., The characteristics of relative permeability curves in naturally fractured carbonate reservoirs, Journal of Canadian Petroleum Technology, Mar. 2012, 6 pages.

Liang, et al., Geometric and topological analysis of three-dimensional porous media: Pore space partitioning based on morphological skeletonization, Journal of Colloid and Interface Science, 221, 2000, 12 pages.

Lim et al., Enhanced deep residual networks for single image super-resolution, In Proceedings of the IEEE conference on computer vision and pattern recognition workshops, Jul. 10, 2017, 9 pages.

Lin et al., Imaging and measurement of pore-scale interfacial curvature to determine capillary pressure simultaneously with relative permeability, Water Resources Research 54, Sep. 8, 2018, 15 pages.

Lin et. al., Minimal surfaces in porous media: Pore-scale imaging of multiphase flow in an altered-wettability Bentheimer sandstone, Physical Review E 99, Jun. 10, 2019, 13 pages.

Lindquist et al., Investigating 3D geometry of porous media from high resolution images, Physics and Chemistry of the Earth, MS No. SE39.2012, 1998, 8 pages.

Lindquist, et al., Medial Axis Analysis of Three Dimensional Tomographic Images of Drill Core Samples, Jan. 27, 1995, 19 pages.

Lindquist, The geometry of primary drainage, Journal of colloid and interface science 296, Nov. 16, 2005, 14 pages.

Lorensen et al., Marching cubes: A high resolution 3d surface construction algorithm, Computer Graphics, vol. 21, No. 4, Jul. 1987, 8 pages.

Lv et. al., In situ local contact angle measurement in a CO2-brine-sand system using microfocused x-ray CT, Research Gate, Jan. 19, 2018, 10 pages.

(56) References Cited

OTHER PUBLICATIONS

Heshmati et al, Experimental investigation of dynamic contact angle and capillary rise in tubes with circular and noncircular cross sections, Langmuir, Oct. 16, 2014, 12 pages.

Ma, et al., Effect of contact angle on drainage and imbibition in regular polygonal tubes, Colloids and Surfaces A: Physicochemical and Engineering Aspects 117, 1996, 19 pages.

Maini et. al., A comparison of steady-state and unsteady-state relative permeabilities of viscocities oil and water in Ottawa sand, The Journal of Canadian Petroleum Technology, Mar.-Apr. 1990, 7 pages.

March et. al., Assessment of CO2 storage potential in naturally fractured reservoirs with dual-porosity models, Water Resources Research 54, Mar. 8, 2018, 20 pages.

Mascini, et al., Event-based contact angle measurements inside porous media using time-resolved micro-computed tomography, Journal of Colloid and Interface Science 572, 2020, 10 pages.

Mason et al., Capillary behavior of a perfectly wetting liquid in irregular triangular tubes, Journal of Colloid and Interface Science, vol. 141, No. 1, Jan. 1991, 13 pages.

Masson, A fast two-step algorithm for invasion percolation with trapping, Computers & Geosciences 90, Feb. 3, 2016, 9 pages.

Mayer et al., Mercury porosimetry—breakthrough pressure for penetration between packed spheres, Journal of Colloid Science 20, Mar. 4, 1965, 19 pages.

Miao et al., A new way to parameterize hydraulic conductances of pore elements: A step towards creating pore-networks without pore shape simplifications, Advances in water resources 105, Apr. 26, 2017, 11 pages.

Mirani et. al., Production-pressure-drawdown management for fractured horizontal wells in shale-gas formations, SPE Reservoir Evaluation & Engineering, Aug. 2018, 16 pages.

Mohamed, et al., A pore-scale experimental investigation of process-dependent capillary desaturation, Advances in Water Resources 114, 2020, 13 pages.

Neuweiler et. al., Experimental and theoretical investigations of drainage in horizontal rough-walled fractures with different correlation structures, Advances in Water Resources 27, Jul. 14, 2004, 15 pages.

Nguyen et. al., Effectiveness of supercritical-CO2 and N2 huff-and-puff methods of enhanced oil recovery in shale fracture networks using microfluidic experiments, Science Direct, 2018, 39 pages.

Oak, Three-Phase Relative Permeability of Water-Wet Berea, SPE/DOE 20183, Apr. 25, 1990, 12 pages.

Ogilvie et. al., Fluid flow through rough fractures in rocks. II: A new matching model for rough rock fractures, Earth and Planetary Science Letters 241, Jan. 4, 2006, 12 pages.

Øren et al, Extending predictive capabilities to network models, SPE journal 3, Jun. 15, 1996, 18 pages.

Øren et al, Reconstruction of Berea sandstone and pore-scale modelling of wettability effects, J Pet Sci Eng, vol. 39, No. 3-4, Jan. 24, 2003, 24 pages.

Ovaysi et al., Multi-GPU acceleration of direct pore-scale modeling of fluid flow in natural porous media, Computer Physics Communications, Apr. 25, 2012, 9 pages.

Ovaysi et al., Pore-scale dissolution of CO2+SO2 in deep saline aquifers, International Journal of Greenhouse Gas Control, Mar. 18, 2013, 15 pages.

Ovaysi et al., Pore-space alteration induced by brine acidification in subsurface geologic formations, Water Resources Research, vol. 50, 440-452, Jan. 17, 2014.

Ovaysi, et al., Direct pore-level modeling of incompressible fluid flow in porous media, Journal of Computational Physics, Jun. 23, 2010, 21 pages.

Ovaysi, et al., Pore-scale modeling of dispersion in disordered porous media, Journal of Contaminant Hydrology, Feb. 15, 2011, 14 pages.

Patzek, Verification of a Complete Pore Network Simulator of Drainage and Imbibition, SPE J. 6, Jan. 10, 2001, 13 pages.

Persoff et al, Two-phase flow visualization and relative permeability measurement in natural rough-walled rock fractures, Water Resources Research vol. 31, May 1995, 12 pages.

Petchsingto, Numerical study of fracture aperture characteristics and their impact on single-phase flow and capillary-dominated displacement, The Pennsylvania State University College of Earth and Mineral Sciences, May 2008, 153 pages.

Piri et al, Prediction of fluid occupancy in fractures using network modeling and x-ray microtomography. II: Results, Physical Review E 76, 2007, 11 pages.

Piri et al, Three-phase threshold capillary pressures in noncircular capillary tubes with different wettabilities including contact angle hysteresis, Physical Review E 70, Dec. 14, 2004, 17 pages.

Piri et al., "Three-dimensional mixed-wet random pore-scale network modeling of two- and three-phase flow in porous media. I. Model description", Physical Review E 71, 026301, 2005, 30 pages.

Piri, et al., Three-dimensional mixed-wet random pore-scale network modeling of two- and three-phase flow in porous media. II. Results, Physical Review E 71, 026301, Feb. 4, 2005, 11 pages.

Princen, Capillary Phenomena in Assemblies of Parallel Cylinders: I. Capillary Rise Between Two Cylinders, Journal of Colloid and Interface Science, 30, 1969, 7 pages.

Princen, Capillary Phenomena in Assemblies of Parallel Cylinders: II. Capillary Rise in Systems With More Than Two Cylinders. Journal of Colloid and Interface Science, 30, 1969, 13 pages.

Princen, Capillary Phenomena in Assemblies of Parallel Cylinders: III. Liquid Columns Between Horizontal Parallel Cylinders. Journal of Colloid and Interface Science, 34, 1970, 14 pages.

Prodanovic et al., A level set method for determining critical curvatures for drainage and imbibition, Elsevier, Journal of Colloid and Interface Science 304, Aug. 23, 2006, 17 pages.

Prodanovic et al., Porous structure and fluid partitioning in polyethylene cores from 3D x-ray microtomographic imaging, Journal of Colloid and Interface Science, 298 (2006), 16 pages.

Prodanovic, et al., 3d image-based characterization of fluid displacement in a berea core. Advances in Water Resources, 30, 2007, 13 pages.

Prodanovic, et al., Imaged-based multiscale network modelling of microporosity in carbonates, Geological Society, 406 (2015), 19 pages.

Pruess, et al., On two-phase relative permeability and capillary pressure of rough-walled rock fractures, Earth Sciences Division, Sep. 1989, 44 pages.

Purcell, Capillary Pressures—Their Measurement Using Mercury and the Calculation of Permeability Therefrom, Shell Oil Company, Petroleum Transactions, AIME, Feb. 1949, 10 pages.

Adler, Transports in fractal porous media, Journal of Hydrology, 187 (1996), 19 pages.

Aghaei, et al., Direct pore-to-core up-scaling of displacement processes: Dynamic pore network modeling and experimentation, Journal of Hydrology 522 2015, 22 pages.

Akai et. al., Quantification of uncertainty and best practice in computing interfacial curvature from complex pore space images, Dept of Earth Sci. & Eng, Jul. 3, 2019, 21 pages.

Aker, et al., A Two-Dimensional Network Simulator for Two-Phase Flow in Porous Media, Transport in Porous Media 32, 1998, pp. 163-186.

Al-Gharbi, et al., Dynamic network modeling of two-phase drainage in porous media. Phys. Rev. E 71, 16308, Jan. 13, 2005, 16 pages.

Alhammadi et. al., Pore-scale x-ray imaging with measurement of relative permeability, capillary pressure and oil recovery in a mixed-wet micro-porous carbonate reservoir rock, Fuel 268, Feb. 29, 2020, 14 pages.

Alizadeh, et al., The effect of saturation history on three-phaserelative permeability: An experimental study, Department of Chemical and Petroleum Eng, University of Wyoming, Jan. 31, 2014, 29 pages.

Al-Raoush et al., Extraction of physically realistic pore network properties from three-dimensional synchrotron x-ray microtomography images of unconsolidated porous media systems, Journal of Hydrology, 300, 2005, 173 pages.

(56) References Cited

OTHER PUBLICATIONS

AlRatrout et. al., Automatic measurement of contact angle in pore-space images, Advances in Water Resources 109, 2017, 12 pages.

Álvaro González, Measurement of areas on a sphere using fibonacci and latitude-longitude lattices. Mathematical Geosciences, 42, 28, Nov. 2009, 17 pages.

An, et al., Transition From Viscous Fingering to Capillary Fingering: Application of GPU-Based Fully Implicit Dynamic Pore Network Modeling, Water Resources Research 56, Oct. 22, 2020, 18 pages.

Anbari et al., Estimation of capillary pressure in unconventional reservoirs using thermodynamic analysis of pore images. JGR: Solid Earth, Nov. 7, 2019, 23 pages.

Anderson, W. G. Wettability Literature Survey—Part 6: The Effects of Wettability on Waterflooding, Journal of Petroleum Technology, Dec. 1987, 18 pages.

Anderson, Wettability Literature Survey—Part 2: Wettability Measurement, Journal of Petroleum Technology, Nov. 1986, 17 pages.

Anderson, Wettability Literature Survey Part 5: The Effects of Wettability on Relative Permeability, Journal of Petroleum Technology, Nov. 1987, 16 pages.

Andrä et al., Digital rock physics benchmarks—part i: Imaging and segmentation, Computers & Geosciences, 50, Sep. 18, 2012, 8 pages.

Andrew, et al., Pore-scale contact angle measurements at reservoir conditions using X-ray microtomography, Advances in Water Resources 68, 2014, 8 pages.

Armstrong, et al., Linking pore-scale interfacial curvature to col. scale capillary pressure, Advances in Water Resources 46, 2012, 8 pages.

Arshadi et. al., Pore-Scale Experimental Investigation of Two-Phase Flow Through Fractured Porous Media, Advancing Earth and Space Science, May 20, 2018, 30 pages.

Ayodele, Theoretical analysis of viscous coupling in two-phase flow through porous media, Transport in Porous Media, 2006, 14 pages.

Bakhshian, et al., Pore-scale characteristics of multiphase flow in heterogeneous porous media using the lattice Boltzmann method, Scientific Reports 9 Mar. 4, 2019, 14 pages.

Balay et al, PETSc Users Manual, Technical Report ANL-95/11 Revision 3.11, Argonne National Laboratory, 2019, 268 pages.

Bear, Modeling Flow and Contaminant Transport in Fractured Rocks, Technion-Israel Institute of Technology, 1993, 37 pages.

Berg et. al., Real-time 3D imaging of Haines jumps in porous media flow, Harvard University, Jan. 17, 2023, 5 pages.

Bertels et. al., Measurement of aperture distribution, capillary pressure, relative permeability, and in situ saturation in a rock fracture using computed tomography scanning, Water Resources Research, vol. 37, No. 3, Mar. 2001, 14 pages.

Bhattad et al, Effect of network structure on characterization and flow modeling using x-ray micro-tomography images of granular and fibrous porous media, Transport in Porous Media 90, 2011, 30 pages.

Blunt et. al., A thermodynamically consistent characterization of wettability in porous media using high-resolution imaging, Journal of Colloid and Interface Science 552, 2019, 7 pages.

Blunt, Effects of heterogeneity and wetting on relative permeability using pore level modeling, SPE Journal, vol. 2, Mar. 1997, 18 pages.

Blunt, et al., Pore-scale imaging and modelling, Advances in Water Resources, 51, 2013, https://doi.org/10.1016/j.advwatres.2012.03.003, 20 pages.

Blunt, Physically-based network modeling of multiphase flow in intermediate-wet porous media. Journal of Petroleum Science and Engineering 20, Jan. 21, 1998, 9 pages.

Blunt, et al., Detailed physics, predictive capabilities and macroscopic consequences for pore-network models of multiphase flow, Advances in Water Resources, 25 (2002), 21 pages.

Brown, Fluid flow through rock joints: The effect of surface roughness, Journal of Geophysical Research, vol. 92, No. B2, Feb. 10, 1987, 11 pages.

Brown, Simple mathematical model of a rough fracture, Journal of Geophysical Research, vol. 100, No. B4, Apr. 10, 1995, 12 pages.

Brush et al., Fluid flow in synthetic rough-walled fractures: Navier-stokes, stokes, and local cubic law simulations, Water Resources Research, vol. 39, No. 4, 1085, Apr. 3, 2023, 15 pages.

Bryant, et al., Prediction of relative permeability in simple porous media, Phys. Rev. A, vol. 46, No. 4, Aug. 15, 1992, 8 pages.

Bultreys et al, Validation of model predictions of pore-scale fluid distributions during two-phase flow, Phys. Rev. E, 97, May 14, 2018, 14 pages.

Chen, Liquid-gas relative permeabilities in fractures: Effects of flow structures, phase transformation and surface roughness, Dissertation, Jun. 2005, 222 pages.

Corey, et. al., Three-Phase Relative Permeability, Gulf Research & Development Co., Nov. 1956, 3 pages.

Culligan et. al., Interfacial area measurements for unsaturated flow through a porous medium, Water Resources Research, vol. 40, W12413, Dec. 22, 2004, 12 pages.

Culligan et. al., Pore-scale characteristics of multiphase flow in porous media: A comparison of air-water and oil-water experiments, Advances in Water Resources 29, 2006, 12 pages.

David et. al., Investigation of the Neumann triangle for dodecane liquid lenses on waters, Colloids and Surfaces A: Physicochemical and Engineering Aspects, 333, 2009, 7 pages.

Desbrun et. al., Implicit fairing of irregular meshes using diffusion and curvature flow, SIGGRAPH 99, 1999, 8 pages.

Detwiler et. al., Interphase mass transfer in variable aperture fractures: Controlling parameters and proposed constitutive relationships, Water Resources Research, vol. 45, Aug. 27, 2009, 21 pages.

Diomampo, Relative permeability through fractures, SGP-TR-170, Aug. 2001, 74 pages.

Dong, et al., Pore-network extraction from micro-computerized-tomography images, Phys. Rev. E 80, 036307, Sep. 14, 2009, 11 pages.

Dong, Micro-CT Imaging and Pore Network Extraction, Dissertation to Dept. of Earth Science and Engineering of Imperial College London, 2007, 30 pages.

Ehrlich, Viscous Coupling in Two-Phase Flow in Porous Media and Its Effect on Realtive Permeabilities, Transport in Porous Media, 11, 1993, 18 pages.

Fatt, The Network Model of Porous Media. AIME Petroleum Transactions, 1956, 38 pages.

Fei, Avizo Reference Guide, Avizo Software for Materials Research, ThermoFisher, 12 pages.

Ferer et. al., Two-phase flow in a rough fracture: Experiment and modeling, Physical Review E84, Jul. 28, 2011, 8 pages.

Fourar, et al., A viscous coupling model for relative permeabilities in fractures, SCA-9825, 9 pages.

Frette, et al., A semi-analytical model for computation of capillary entry pressures and fluid configurations in uniformly-wet pore spaces from 2d rock images. Advances in Water Resources 33, May 11, 2010, 21 pages.

Garing et al., Pore-scale capillary pressure analysis using multi-scale x-ray micromotography, https://www.sciencedirect.com/science/article/pii/S0309170816305437, 2017, 38 pages.

Gesho, et al., Pore Network Extraction Algorithm and Geometrical Upscaling—Theoretical Description, Water Resource Research, Jun. 1, 2016, 39 pages.

Gjennestad, et al., Stable and Efficient Time Integration of a Dynamic Pore Network Model for Two-Phase Flow in Porous Media. Frontiers in Physics. Jun. 13, 2018, 16 pages.

Glass et. al., A modified invasion percolation model for low-capillary number immiscible displacements in horizontal rough-walled fractures: Influence of local in-plane curvature, Water Resources Research, vol. 34, No. 12, Dec. 1998, 20 pages.

Gong et. al., Dynamic pore-scale modeling of residual fluid configurations in disordered porous media, E3S Web of Conferences 366, 2013, https://doi.org/10.1051/e3sconf/202336601018, 13 pages.

Gong et. al., Dynamic pore-scale modeling of residual trapping in a rough-walled fracture, Transport in Porous Media, 140, May 11, 2021, 38 pages.

(56) References Cited

OTHER PUBLICATIONS

Gong et. al., Parallel dynamic pore-network modeling package for two-phase flow in fractures and solute transport in disordered porous media and rough-walled fractures, Dissertation, Jun. 23, 2001, 245 pages.

Gong, et al., Dynamic Pore-Scale Modeling of Residual Trapping Following Imbibition in a Rough-walled Fracture, Transport in Porous Media 140, May 11, 2021, 37 pages.

Gong, et al., Pore-to-Core Upscaling of Solute Transport Under Steady-State Two-Phase Flow Conditions Using Dynamic Pore Network Modeling Approach, Transport in Porous Media 135, Sep. 15, 2020, 38 pages.

Gong, et al., Two-Phase Relative Permeability of Rough-Walled Fractures: A Dynamic Pore-Scale Modeling of the Effects of Aperture Geometry, Water Resources Research, Nov. 18, 2021, 38 pages.

Gong, Dynamic pore network modeling of two-phase flow and solute transport in disordered porous media and rough-walled fractures, Dissertation, Dept of Petroleum Engineering, Aug. 2021, 245 pages.

Goodfellow, et al., Generative adversarial nets. Advances in Neural Information Processing Systems, https://www.github/com/goodfeli/adversarial, 9 pages.

Gostick, Versatile and efficient pore network extraction method using marker-based watershed segmentation, Phys Rev E, vol. 96, Aug. 16, 2017, 15 pages.

Guo et. al., Thermal drawdown-induced flow channelling in a single fracture in EGS, Geothermics 61, Jan. 28, 2016, 17 pages.

Hammond, et al., A Dynamic Pore Network Model for Oil Displacement by Wettability-Altering Surfactant Solution. Transp Porous Med 92, Jan. 10, 2012, 30 pages.

Hart et al, A Formal Basis for the Heuristic Determination of Minimum Cost Paths, IEEE Transactions on Systems Science and Cybernetics, vol. 4, No. 2, Jul. 1968, 8 pages.

Hassanizadeh et al, Thermodynamic basis of capillary pressure in porous media, Water resources research, Oct. 1993, 17 pages.

Hassler et al., Measurement of Capillary Pressures in Small Core Samples, Los Angeles Meeting Oct. 1944, 10 pages.

Helland et al, Characterization of pore shapes for pore network models, Proceedings of the 11th European Conference on the Mathematics of Oil Recovery (ECMOR XI), Sep. 2008, 13 pages.

Helland et al, Computation of fluid configurations and capillary pressures in mixed-wet 2d pore spaces from rock images, Proceedings of the XVIII International Conference on Water Resources, Jun. 2010, 12 pages.

Herring et al., Flow rate impacts on capillary pressure and interface curvature of connected and disconnected fluid phases during multiphase flow in sandstone, Advances in Water Resources 107, 2017, 10 pages.

Honarpour et al, Relative-permeability measurements: An overview, SPE Technology Today Series, Aug. 1988,4 pages.

Huang et al, Water Slippage versus Contact Angle: A Quasiuniversal Relationship. Phys. Rev. Lett. 101 226101, Nov. 28, 2008, 4 pages.

Hughes et al, Network modeling of multiphase flow in fractures, Advances in Water Resources 24, 2001, 13 pages.

Hughes et al, Pore Scale Modeling of Rate Effects in Imbibition, Transport in Porous Media 40, 2000, 29 pages.

Hui et al, Effects of wettability on three-phase flow in porous media, The Journal of Physical Chemistry B 104, Feb. 17, 2000, 13 pages.

Huo et al, Experimental investigation of stress-dependency of relative permeability in rock fractures, Transp Porous Med 113, 2016, 25 pages.

Ibekwe et al, Automated extraction of in situ contact angles from micro-computed tomography images of porous media, Computers and Geosciences 137, Feb. 3, 2020, 12 pages.

Idowu, et al., Pore-Scale Modelling of Rate Effects in Waterflooding. Transport in Porous Media 83, 2010, 20 pages.

Joekar-Niasar et. al., Insights into the relationships among capillary pressure, saturation, interfacial area and relative permeability using pore-network modeling, Transp Porous Med 74, 2008, 20 pages.

Kang et al, Lattice Boltzmann pore-scale model for multicomponent reactive transport in porous media, Journal of Geophysical Research: Solid Earth 111, 2006, 12 pages.

Kang et al, Minimized Capillary End Effect During CO2 Displacement in 2-D Micromodel by Manipulating Capillary Pressure at the Outlet Boundary in Lattice Boltzmann Method, Water Resources Research 54, 2018, 21 pages.

Karpyn et. al., Visualization of fluid occupancy in a rough fracture using micro-tomography, Journal of Colloid and Interface Science 307, 2007, 7 pages.

Karpyn, et al., Prediction of fluid occupancy in fractures using network modeling and x-ray microtomography. I: Data conditioning and model description, Physical Review E 76, 016315, Jul. 31, 2007, 13 pages.

Karypis et al, A fast and high quality multilevel scheme for partitioning irregular graphs, Society for Industrial and Applied Mathematics Journal vol. 20 No. 1, 1998, 35 pages.

Keller et. al., Behavior of nonaqueous phase liquids in fractured porous media under two-phase flow conditions, Transport in Porous Media 38, 2000, 16 pages.

Khishvand, et al., An Improved Insight into Low-Salinity Waterflooding: In-Situ Characterization of Wettability Alteration at Elevated Pressure and Temperature Conditions, SCA2016_Temp032, Aug. 2016, 12 pages.

Khishvand, et al., In situ characterization of wettability alteration and displacement mechanisms governing recovery enhancement due to low-salinity waterflooding. Water Resources Research 53, May 31, 2017, 17 pages.

Khishvand, et al., In-situ Characterization of Wettability and Pore-scale Displacements during Two- and Three-phase flow in Natural Porous Media, Department of Petroleum Engineering, 2016, 52 pages.

Khishvand, et al., Micro-scale experimental investigation of the effect of flow rate on trapping in sandstone and carbonate rock samples. Advances in Water Resources 94, May 20, 2016, 21 pages.

Klise et. al., Automated contact angle estimation for three-dimensional x-ray microtomography data, https://www.scienedirect.com/science/article/pii/S0309171815002651, 2015, 14 pages.

Kohanpur, et al., Pore-Network Stitching Method: A Pore-to-Core Upscaling Approach for Multiphase Flow. Transport in Porous Media, Oct. 27, 2020, 28 pages.

Kuang, et al., Pore-Scale Sweep Efficiency Enhancement by Silica-Based Nanofluids in Oil-Wet Sandstone, Energy Fuels 2020, 12 pages.

Lago et al, Threshold pressure in capillaries with polygonal cross section, Journal of colloid and interface science 243, 2001, 8 pages.

Lanetc et al, Coupling of transient matrix diffusion and pore network models for gas flow in coal, Journal of Natural Gas Science and Engineering 88, 2021, 12 pages.

Laubach et. al., Are open fractures necessarily aligned with maximum horizontal stress, Earth and Planetary Science Letters 222, Feb. 17, 2004, 5 pages.

Ledig, et al., Photo-realistic single image super-resolution using a generative adversarial network., IEEE Conference on Computer Vision and Pattern Recognition, May 25, 2017, 19 pages .

Lemonnier et al, Simulation of naturally fractured reservoirs. State of the art-part 1-physical mechanisms and simulator formulation, Oil & Gas Science and Technology—Rev. IFP vol. 65, 2010, 24 pages.

* cited by examiner

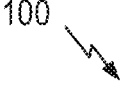
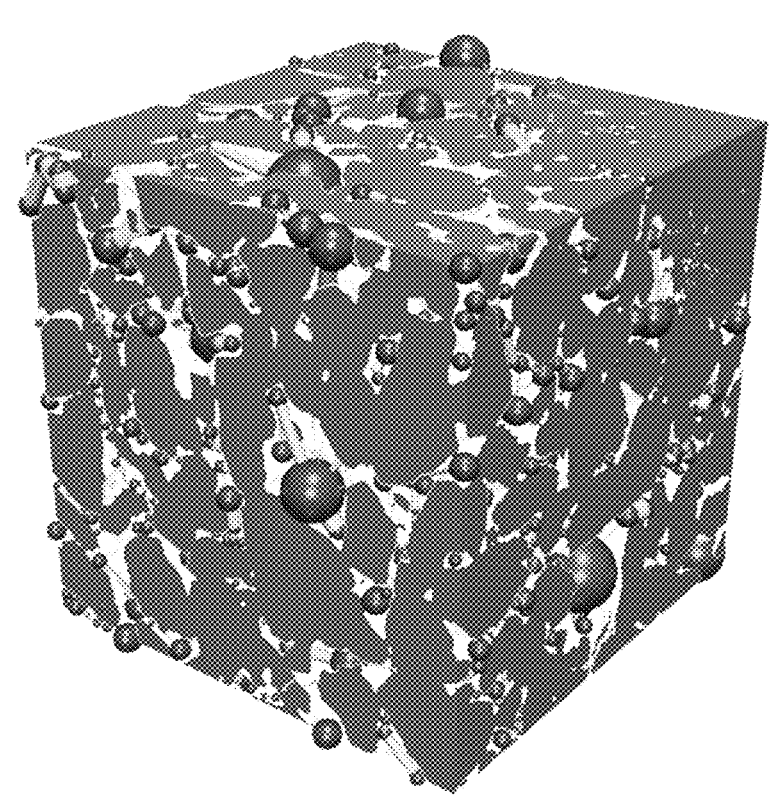
FIG. 1A
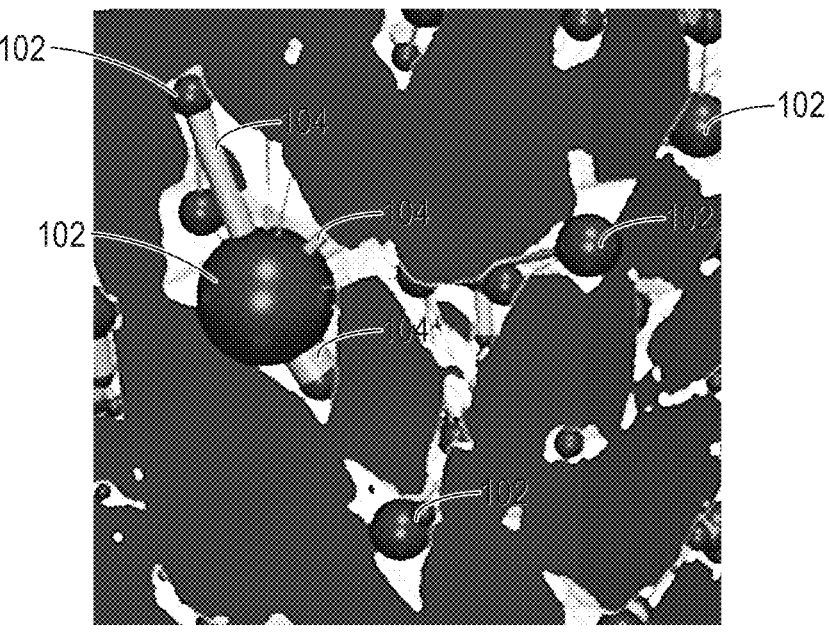
FIG. 1B

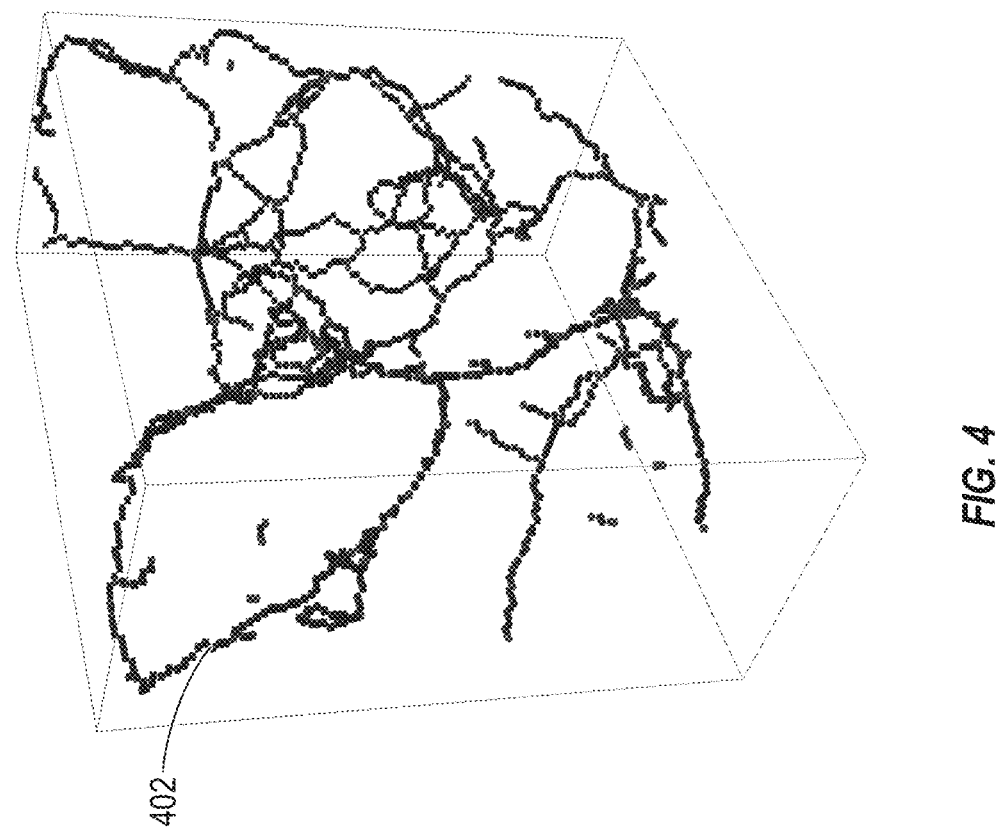
402
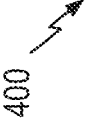
400
*FIG. 4*

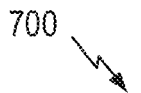
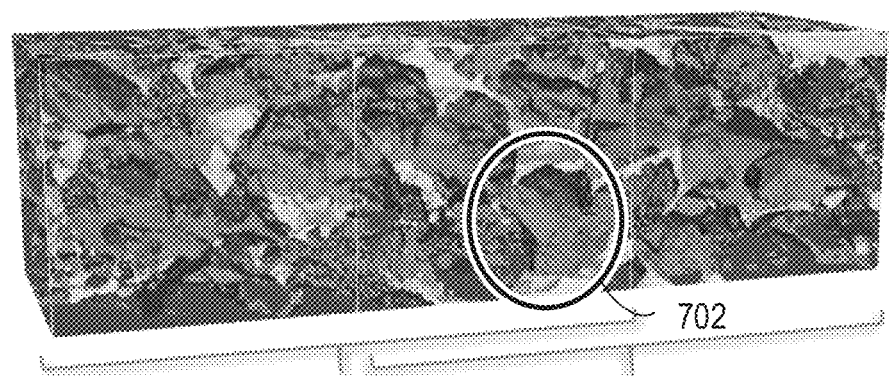
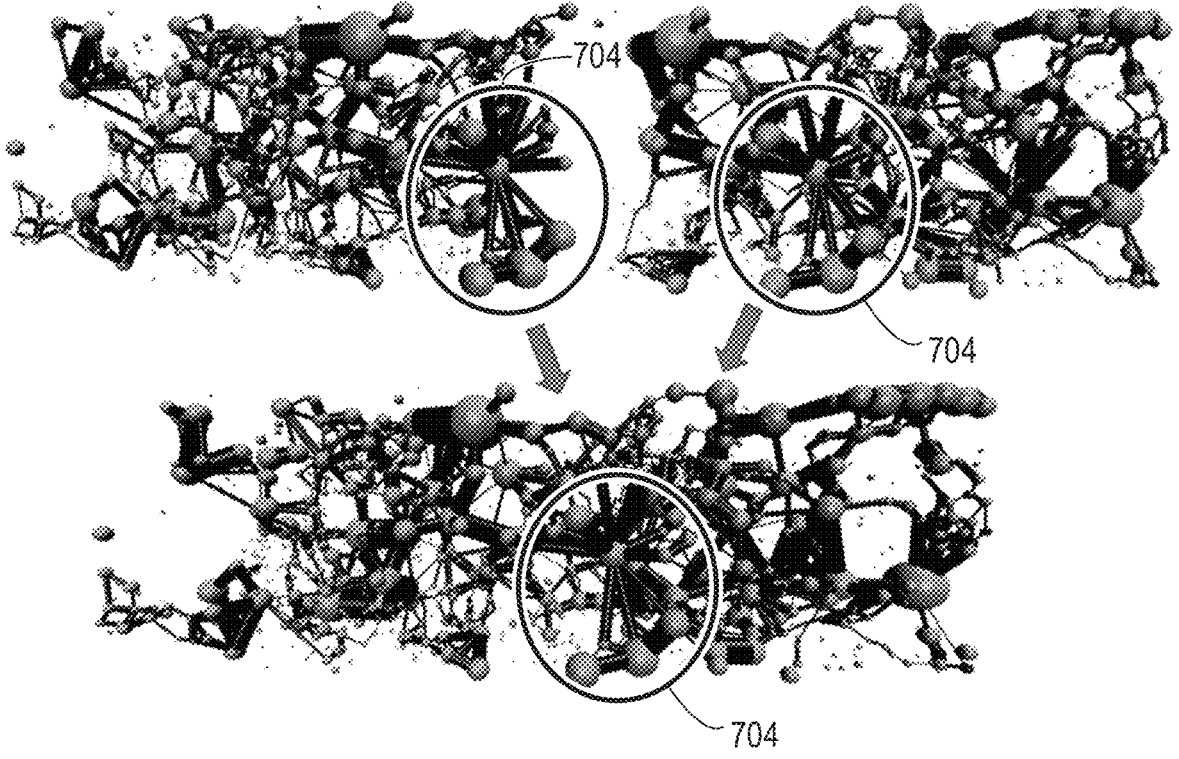
*FIG. 7*

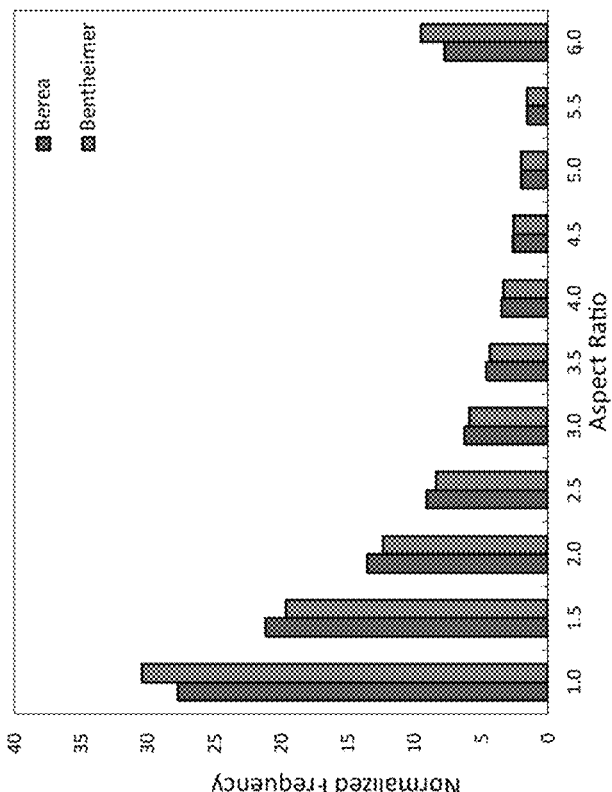
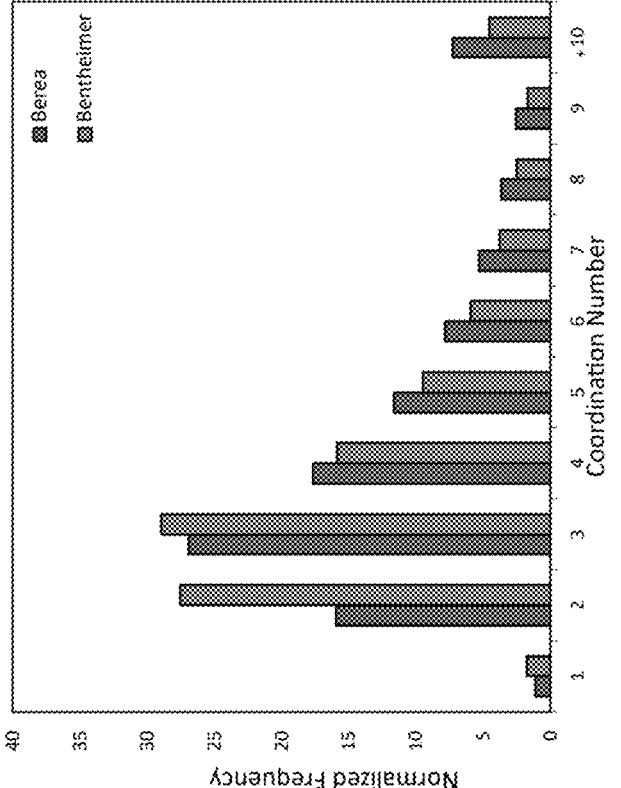
*FIG. 9*

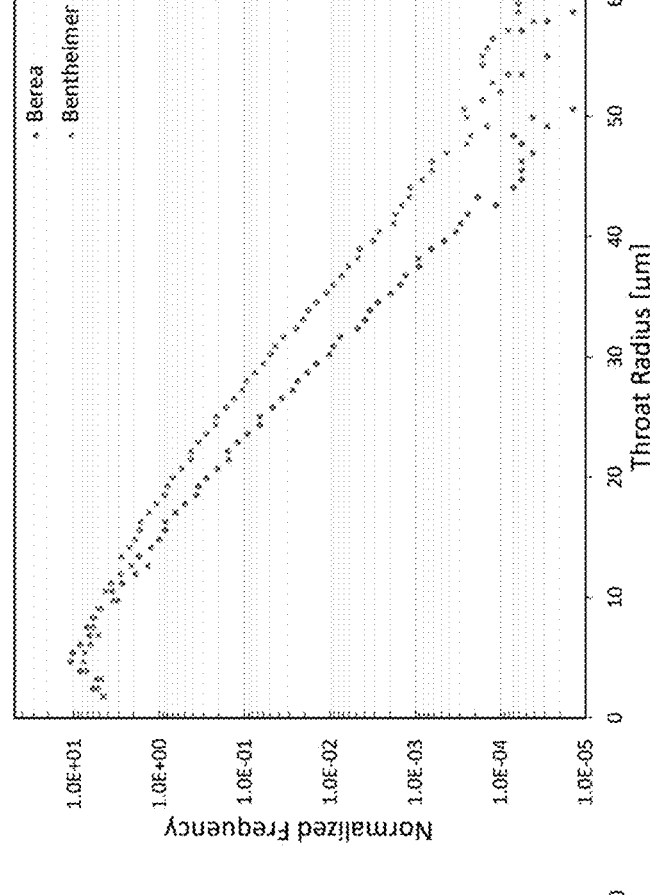
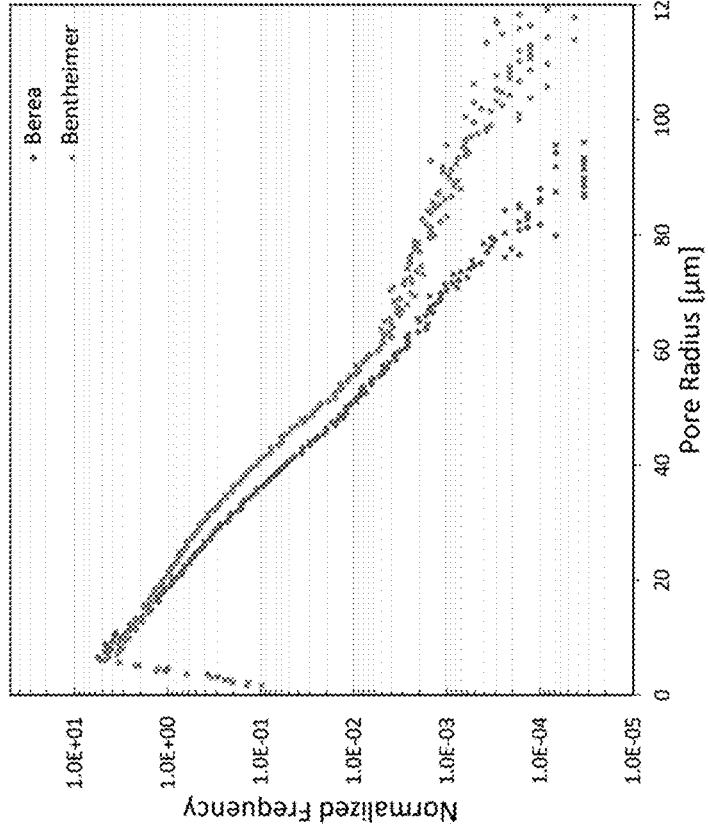
*FIG. 10*

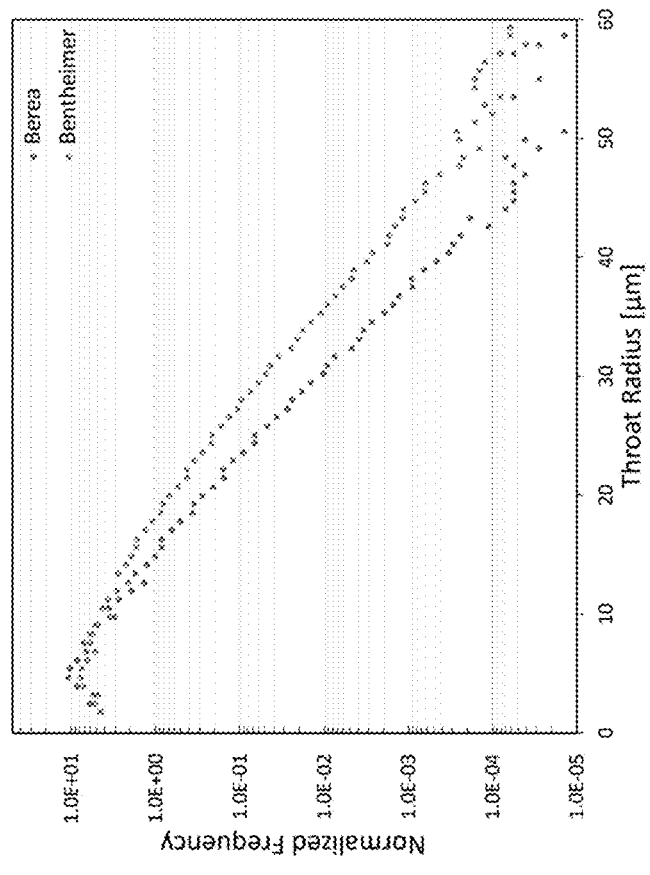
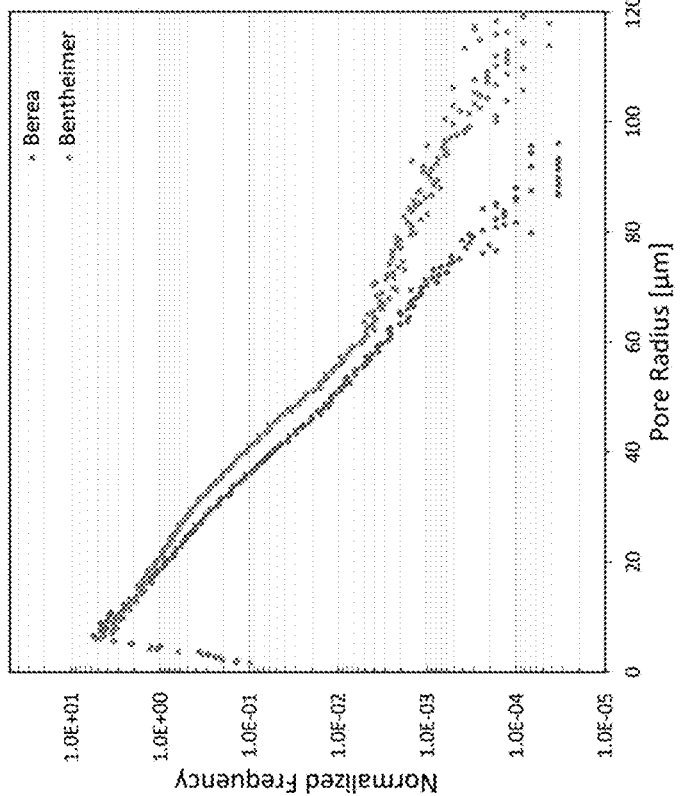
FIG. 11

1200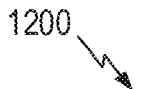

A METHOD FOR PORE NETWORK EXTRACTION BY ONE OR MORE CENTRAL PROCESSING UNITS (CPU)

1202

OBTAIN A GLOBAL IMAGE OF A POROUS MEDIA SAMPLE

1204

DECOMPOSE THE GLOBAL IMAGE INTO A SET OF OVERLAPPING SUBIMAGES

1206

EXTRACT A SET OF SUBNETWORKS CORRESPONDING TO THE SET OF OVERLAPPING SUBIMAGES

1208

OBTAIN A COHESIVE PORE NETWORK REPRESENTATIVE OF THE POROUS MEDIA SAMPLE BY MERGING THE SET OF SUBNETWORKS

1210

OUTPUT THE COHESIVE PORE NETWORK

FIG. 12

METHODS AND DEVICES FOR SEAMLESS PORE NETWORK EXTRACTION

CROSS-REFERENCE TO RELATED APPLICATIONS

This applications claims benefit of U.S. Provisional Patent Application No. 63/402,003, filed Aug. 29, 2022, the entirety of which is herein incorporated by reference.

BACKGROUND

Field

Aspects of the present disclosure generally relate to methods and systems for physical characterization of porous media, and more particularly, to techniques for pore network extraction.

Description of the Related Art

Modeling techniques for fluid flow through porous media are broadly implemented for petroleum resource development, materials engineering, food packaging, and medical technology development. Fluid flow modeling techniques may be equipped to illustrate both physical and chemical media properties like permeability, capillary pressure, fluid saturation, contact angle, wettability, or other similar properties, which may be used to characterize fluid behavior.

Although current techniques for modeling fluid flow through porous media are based on technological advancements made over many years, resultant models may still be tenuous representations of actual porous media. For example, fluid flow models of porous media exceeding a few millimeters may require a lower resolution implementation to match currently available computational capabilities. As a result, fluid flow models based on porous media of a larger scale may not accurately reflect physical and chemical properties of the media. Accordingly, there is an impetus to improve the accuracy of fluid flow modeling, including, for example: improving image processing techniques to allow for higher resolution model input and model output, improving image processing techniques to allow for more accurate model input and model output, enhancing computational processing capability to reduce computational expense, enhancing computational processing capability increase modeling speed, increasing automation for iterative modeling steps, improving model capability for dynamic modeling of different fluid flow environments, improving model capability for dynamic modeling of larger fluid flow environments, and the like.

Consequently, there exists a need for further improvements in fluid flow modeling of porous media to overcome the aforementioned technical challenges and other challenges not mentioned.

SUMMARY

One aspect of the present disclosure provides a method for pore network extraction by one or more central processing units (CPU). The method may include obtaining a global image of a porous media sample. The method may include decomposing the global image into a set of overlapping subimages. The method may include extracting a set of subnetworks corresponding to the set of overlapping subimages. The method may include obtaining a cohesive network representative of the porous media sample by merging the set of subnetworks.

Other aspects provide: an apparatus operable, configured, or otherwise adapted to perform the aforementioned methods as well as those described elsewhere herein; a non-transitory, computer-readable media comprising instructions that, when executed by a processor of an apparatus, cause the apparatus to perform the aforementioned methods as well as those described elsewhere herein; a computer program product embodied on a computer-readable storage medium comprising code for performing the aforementioned methods as well as those described elsewhere herein; and an apparatus comprising means for performing the aforementioned methods as well as those described elsewhere herein. By way of example, an apparatus may comprise a processing system, a device with a processing system, or processing systems cooperating over one or more message passing interfaces.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only example aspects and are therefore not to be considered limiting of its scope, may admit to other equally effective aspects.

FIG. 1A depicts an example pore network model extracted from a porous media sample made of sandstone.

FIG. 1B depicts an example set of high-resolution porous media image taken by a scanning instrument from a single rock sample and segmented for characterization.

FIG. 4 depicts example output from medial axis subgraph construction procedure, according to aspects of the present disclosure.

FIG. 7 illustrates an example network merged from a set of extracted sub-networks, according to aspects of the present disclosure.

FIG. 9 depicts example distributions of coordination numbers and aspect ratios for pore network generated according to aspects of the present disclosure.

FIG. 10 depicts example distributions of pores and pore throats for pore networks generated according to aspects of the present disclosure.

FIG. 11 depicts example distributions of pore spacing and shape factors for pore networks generated according to aspects of the present disclosure.

FIG. 12 is a flow diagram illustrating certain operations by one or more CPUs, according to certain aspects of the present disclosure.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

Figure 2:
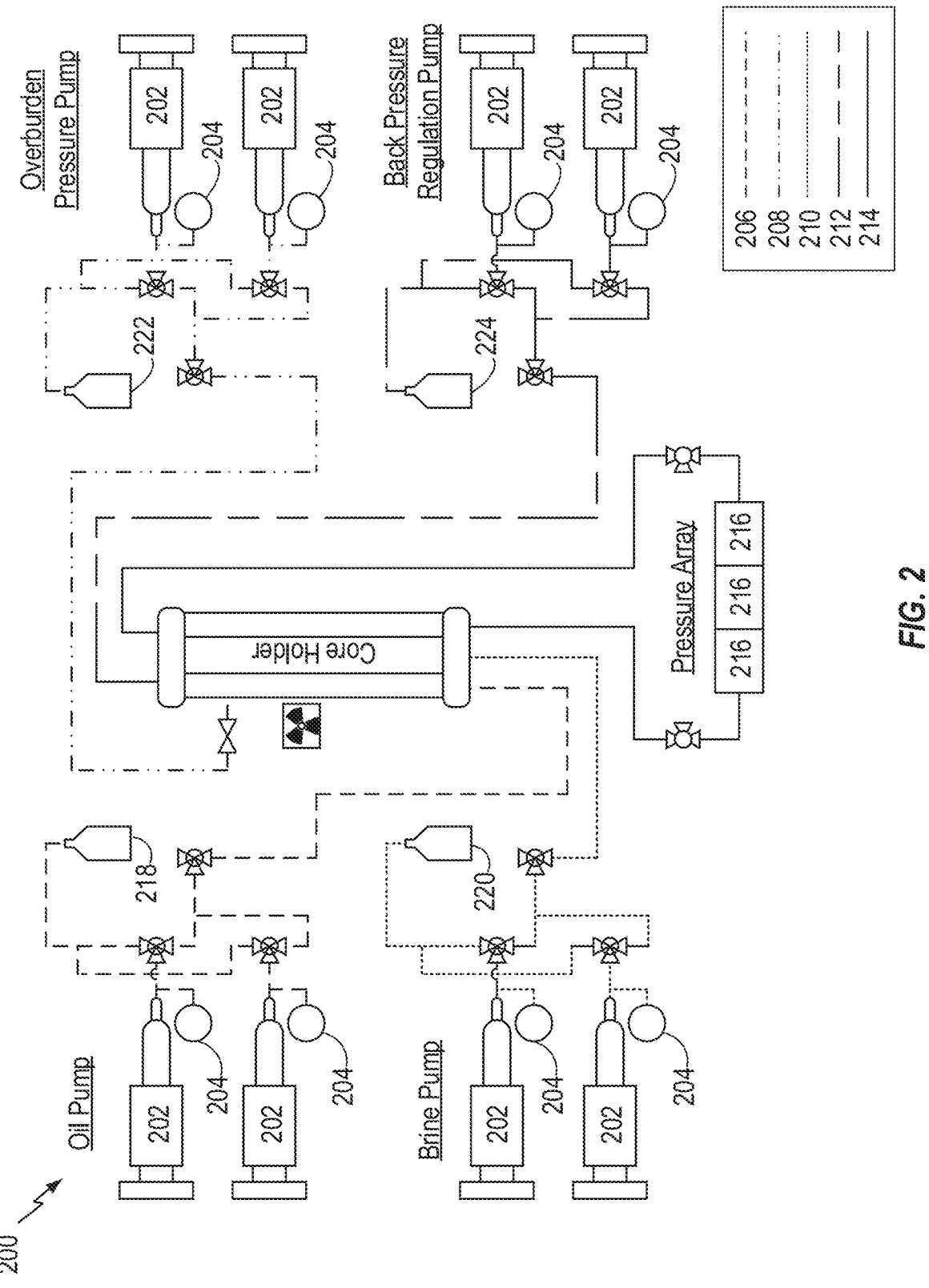
FIG. 2 depicts an example core-flooding instrument for determining the physical and chemical characteristics of a porous media sample.

In the following, reference is made to aspects of the disclosure. However, it should be understood that the disclosure is not limited to specifically aspects described. Instead, any combination of the following features and elements, whether related to different aspects or not, is contemplated to implement and practice the disclosure. Furthermore, although aspects of the disclosure may achieve advantages over other possible solutions and/or over the prior art, whether or not a particular advantage is achieved by a given aspect is not limiting of the disclosure. Thus, the following aspects, features, aspects, and advantages are merely illustrative and are not considered elements or limitations of the appended claims except where explicitly recited in a claim(s). Likewise, a reference to "the disclosure" shall not be construed as a generalization of any inventive subject matter disclosed herein and shall not be considered to be an element or limitation of the appended claims except where explicitly recited in a claim(s).

The present disclosure relates to techniques for pore network extraction performed on porous media. Specifically, the techniques discussed herein may be implemented for use in generating accurate, high resolution pore networks representative of porous media that may be enabled for use in pore network modeling. The porous media may comprise a digital rock sample, a core sample, a plastic sample, a tissue sample, or any other organic or inorganic sample having pore space ascertainable through imaging techniques.

A thorough grasp of fluid flow through pore networks of material with substantial pore space may be consequential to enhancing technical efficacy of fluid flow techniques in a wide range of industries. Models of fluid flow through a pores of a material may be used to describe physical and chemical characteristic of the material. Such models may help to highlight optimal usage for a certain porous material. In many cases, networks of pores within a material are microscale in size. Techniques for characterizing these pore networks are hindered by the computational expense of modeling at a microscale. Often, to alleviate computational burdens, pore network modeling techniques use lower resolution image at the expense of model accuracy. Extrapolation errors caused by low resolution characterization may result in mischaracterization of physical and chemical characteristics of the porous material. Accordingly, ideal modeling of fluid flow through porous media would allow for rapid, accurate microscale pore network extraction that may be performed without inhibitive computational expense.

Aspects of the present disclosure provide techniques for generating heterogeneous digital representations of porous media (e.g., digital plugs) that replicate the key physical properties of heterogeneous porous media samples. Specifically, one or more processors may be configured to replicate and merge sub-networks that represent distinct physical formations (e.g., layering, facies, sub-structures) within the sample to mimic the structure of the porous media sample. Additionally, the one or more processors may generate these digital plugs from cuttings of the porous media sample, which may be used to predict physical properties of large-scale bodies from which the porous media sample is derived when physical samples of the large scale bodies are unavailable.

Aspects of the present disclosure provide techniques for efficient pore network extraction that utilize seamless merging procedures to extract large-scale (e.g., core-sized) pore networks directly from high resolution segmented micro-CT images of porous media samples. These techniques may be implemented by one or more processors operating in parallel, which allows the entire computational workload of the extraction process to be distributed across multiple processing nodes. This allows for increased efficiency in the extraction of deterministic pore networks with physical dimensions that match that of porous media samples used in conventional flooding experiments.

Implementation of techniques for efficiently generating high-resolution pore networks as described herein may enhance pore network modeling functionality by reducing porous material characterization errors to the benefit of all users seeking a more comprehensive understanding of any given porous material.

Introduction to Pore Network Modeling

Modeling techniques for fluid flow through porous media may illustrate both physical and chemical porous media properties. Models of porous media may be used to ascertain permeability, capillary pressure, fluid saturation, wettability, buoyancy, and the like to a greater degree of accuracy comparable to physical flooding of a porous media sample. Additionally, physical and chemical properties determined using pore network modeling techniques may be used to characterize in-situ fluid behavior as it travels through the porous media under a wide variety of wettability and flooding conditions. These conditions may not be accessible to users performing conventional physical flooding characterization techniques.

Permeability is the tendency of the porous media to allow liquids to flow through it. Capillary pressure is the pressure difference existing across the interface separating two immiscible fluids. Fluid saturation is the measurement of fluid present in the pore spaces of the porous media. Contact angle is a measured angle between a fluid-fluid or a fluid-gas interface at a point where it meets a solid surface. Wettability is the ability of a liquid to maintain contact with a solid surface. Wettability may vary depending on wettability conditions and the type of wetting liquid present in the porous media sample. For example, a water-wet medium may show a lower wetting affinity to the oil phase than an oil-wet medium, where higher or lower wetting is determined with respect to a given phase. In certain cases, the correlation between the wettability and viscosity ratio may not be straightforward, as there may be water- or oil-wet conditions with similar viscosities.

A modeled pore network is a practical description of a porous medium targeted for fluid flow modeling. FIG. 1A illustrates an example section 100 of a pore network extracted from porous sandstone. The section of the pore network describes the porosities of various size and shape present in that portion of the sandstone, and may be used to model fluid flow through those porosities for various wettability conditions. Three-dimensional (3D) portions of a pore network model may more accurately characterize the porous media sample either alone or in combination with other 3D portions of the pore network model.

Dynamic pore network models (e.g., of FIG. 1A) may be extracted from images of a targeted porous medium and used to model multi-phase fluid flow using physically-based displacement mechanisms (PBDMs) across pores defined in a pore network. PBDMs may represent an estimated displacement of a modeled fluid in response to movement of another fluid or gas within the pore network. As immiscible phases react with one another throughout the pore network during fluid flooding, PBDMs are induced where, for example, capillary pressure across a meniscus exceeds the wettability constraints on either phase. Fluid saturation, contact angle, buoyancy, and the like may also affect PBDMs throughout a pore network. By utilizing a pore network model extracted from a porous media sample, a user may be able to ascertain PBDMs through the porous media sample under a wide variety of wettability conditions in order to ultimately obtain, for example, useful permeabilities for a larger sample of the porous medium without degrading a porous media sample via repeated physical flooding.

To properly generate PBDMs at a pore scale for the targeted porous media, imaging may capture complex geometries of the targeted porous media at a resolution sufficiently high to retain acceptable accuracy. An example of these geometries is illustrated in FIG. 1B. Pores may be defined as a complex polyhedron having at least a center 102 and spherical and effective diameters. Connective throats 104 between pores may also be defined. In many cases, image resolution may be in micrometers or nanometers to capture applicable pore detail. High-resolution pore models allow for accurate rendering of the fluid flow characteristics described above as ascertained at each pore and for each PBDM.

PBDMs may occur upon flooding or draining of a dynamic pore network model, where aqueous phase injection or removal is iteratively simulated through the pore network. Aqueous flooding and aqueous draining may be implemented in various modeled wettability conditions, where certain fluids are present prior to the start of modeling. Wettability conditions may include at least water-wet, oil-wet, or mixed-wet conditions. During aqueous flooding, injected water may displace immiscible fluid preexisting in the pore network model. During aqueous draining, injected immiscible fluid may displace water preexisting in the pore network model. In certain cases, flooding and draining may be fluid flooding and fluid draining. In some cases, fluid may be oil.

Flooding or draining of a dynamic pore network model may be simulated based in part on scanned images of physical flooding implemented by a flooding instrument 200 of FIG. 2. In some cases, a porous media may undergo a core-flooding experiment to establish an irreducible water saturation, a residual oil saturation, or both. Core-flooding may be enabled by a set of pumps 202, rupture disks 204, pump lines 206-214, differential pressure transducers 216, and source buckets 218-224 working in tandem to flood a porous media sample loaded in a core holder. In some cases, a scanning instrument (e.g., a micro computed tomography (micro-CT) scanner) captures a dry reference image prior to flooding. Scanning occurs in a field of view defined within the core holder. In some cases, the porous media sample may be flooded with brine from bucket 220 via the brine tubing line 206 and scanned again to ensure that the porous media sample is fully saturated. Once the brine flooding is complete, the absolute permeability of the porous media sample may be obtained. The oil flooding may be performed alongside additional brine flooding. Any fluid expelled as a result of overburden pressure (i.e., pressure that compacts pore space and reduces permeability) may be transported via the confining fluid line 208 and collected in bucket 222. Any fluid expelled as a result of the flooding procedure may be transported via the effluent fluid line 212 and collected in bucket 224. In many cases, core sample pressure may be iteratively adjusted during flooding. Pressure may be recorded by one or more differential pressure transducers 216 coupled to the core holder via a transducer line 214.

Scanned images obtained from flooding procedures performed by the flooding instrument 200 of FIG. 2 may be used to extract a pore map representative of the porous media sample. The images may be processed to determine characteristics of fluid flow through the porous media sample. In many cases, the images may also be used to extract a representative pore network model.

Imaging of porous media is typically performed using micro-CT imaging. In many cases, commercial micro-CT scanners (e.g., Zeiss scanners) are available for imaging necessary to perform pore network modeling. Images of porous media taken by micro-CT scanners are at a sufficiently high resolution to create a microscale digital image of the porous media.

In the current state of the art, there exists a challenge of extracting porous media characteristics in a manner precise and repeatable to ensure the ultimate stability of future models. Currently, techniques for porous media characterization require lengthy step-wise processing known to incur undue computational expense and introduce instability to characterization of the porous media sample. As a result, users may not be able to rely on characterization output to simulate flow conditions in a useful way.

Aspects Related to Pore Network Extraction

In the current state of the art, there exists a challenge of predicting fluid flow through porous media in a manner precise and repeatable to ensure the ultimate stability of future models. Currently, techniques for two-phase fluid flow prediction require lengthy step-wise processing known to incur undue computational expense and introduce instability to characterization of the porous media sample. As a result, users may not be able to rely on characterization output to simulate flow conditions in a useful way.

Fluid flow modeling through porous media is often utilized to enhance petroleum resource development. In recent years, global demand for energy resources has mobilized development of petroleum reservoirs as targets for hydrocarbon extraction. Example geological formations that comprise these hydrocarbon reservoirs are ultra-tight shale formations resistant to primary petroleum extraction techniques. A matrix of an ultra-tight shale reservoir may be characterized by low permeability and low porosity. To extract hydrocarbons from the ultra-tight shale matrix, secondary and tertiary petroleum extraction techniques seek to maximize oil production through the microscale pore networks that comprise a substantial amount of the porosity in the shale matrix.

A robust understanding of fluid flow through microscale pore networks of unconventional reservoirs may be consequential to extracting the trillions of barrels of oil still housed in shale formations globally. Models of fluid flow through a pore network that describe permeability, capillary pressure, fluid saturation, and wettability may help to elucidate specific steps to be taken during resource development to optimize petroleum production. Even so, techniques for characterizing these microscale pore networks are hindered by the computational expense of modeling sub-resolution pore network and extrapolation errors caused by unstable characterization of pore geometries.

As discussed above, ideal modeling of fluid flow through porous media would allow for high resolution imaging of a macro-sized porous media sample. In a case where the porous media sample is, for example, a cylindrical core sample of a rock having a length of six inches and a diameter of one inch, the core sample is likely to have porosity and permeability that vary across its length and width. This is common in core samples, and especially in core samples representative of ultra-tight oil formations. Geological processes that form certain oil-bearing rocks can produce heterogeneous morphological features in the rock that may be present even at a nanometer scale. This is especially true for oil bearing carbonate rocks, which contain micro-porosities that contribute significantly to the overall porosity of the rock. These microscale morphological features may affect the pore network of the core sample, altering the porosity and permeability throughout a core sample. Thus, accurate characterization of fluid flow through a core sample may depend on microscale resolution sufficient to detect heterogeneous properties of a pore network.

Although existing pore network extraction techniques have been useful to generate pore networks, the output is often limited to a millimeter scale as a result of computational complexity limits inherent to extracting larger-scale pore networks. Recent developments to micro-CT scanning technologies allowed for miniature-core-sized samples to be scanned at high resolutions. In order to feasibly extract networks from images of this magnitude (e.g., about $10^{11}$ voxels), aspects of the present disclosure provide more robust extraction techniques that address previous limitations.

According to certain aspects, a seamless pore network extraction technique may extract pore networks that are in one-to-one correspondence with a large-scale (e.g., core-sized) porous media sample within a reasonable computational time. Techniques described herein allow for partitioning of void space into pore bodies and pore throat elements as primarily determined by the local geometry of the pore space. As a result, if two image volumes contain an overlapping domain that sufficiently delineates the void spaces, their extracted networks may be in correspondence over this region. Therefore, aspects of the current disclosure allow the pore network extraction (PNE) workload, which has traditionally been a serial and computationally expensive process, to be distributed across decomposed regions of the image. A representative pore network of the entire pore space is obtained by seamlessly combining constitutive subnetworks through their overlapping regions.

In some examples, the robustness of the seamless PNE procedure may be demonstrated by analyzing pore networks extracted from high-resolution micro-CT images of sandstone samples. Sandstone samples may be miniature core-sized cylinders 5-12 millimeters (mm) in diameter and 75-100 mm in length.

According to aspects of the present disclosure, the PNE procedure may be performed by a processing system architecture comprising at least one or more CPUs operating independently or in combination with one or more graphics processing units GPUs. The one or more CPUs and/or the one or more GPUs may perform the stitching procedures according to a non-transitory computer readable medium that causes the one or more CPUs and/or the one or more GPUs to perform any and all steps of the stitching procedure. Each of the one or more CPUs may be utilized in combination with a memory having the computer readable medium stored thereon. Each of the one or more CPUs be utilized in combination with one or more processors. Each of the one or more processors may be parallel processors. Each of the one or more GPUs may be utilized in combination with a memory having the computer readable medium stored thereon. Each of the one or more GPUs be utilized in combination with one or more processors. Each of the one or more processors may be parallel processors. Each of the CPUs and the GPUs may operate independently, or may operate using a message passing interface (MPI) enabling communication between one or more parallel processors for performing the image stitching procedure. This may include CPU-CPU communication, CPU-GPU communication, and/or GPU-GPU communication.

Figure 3:
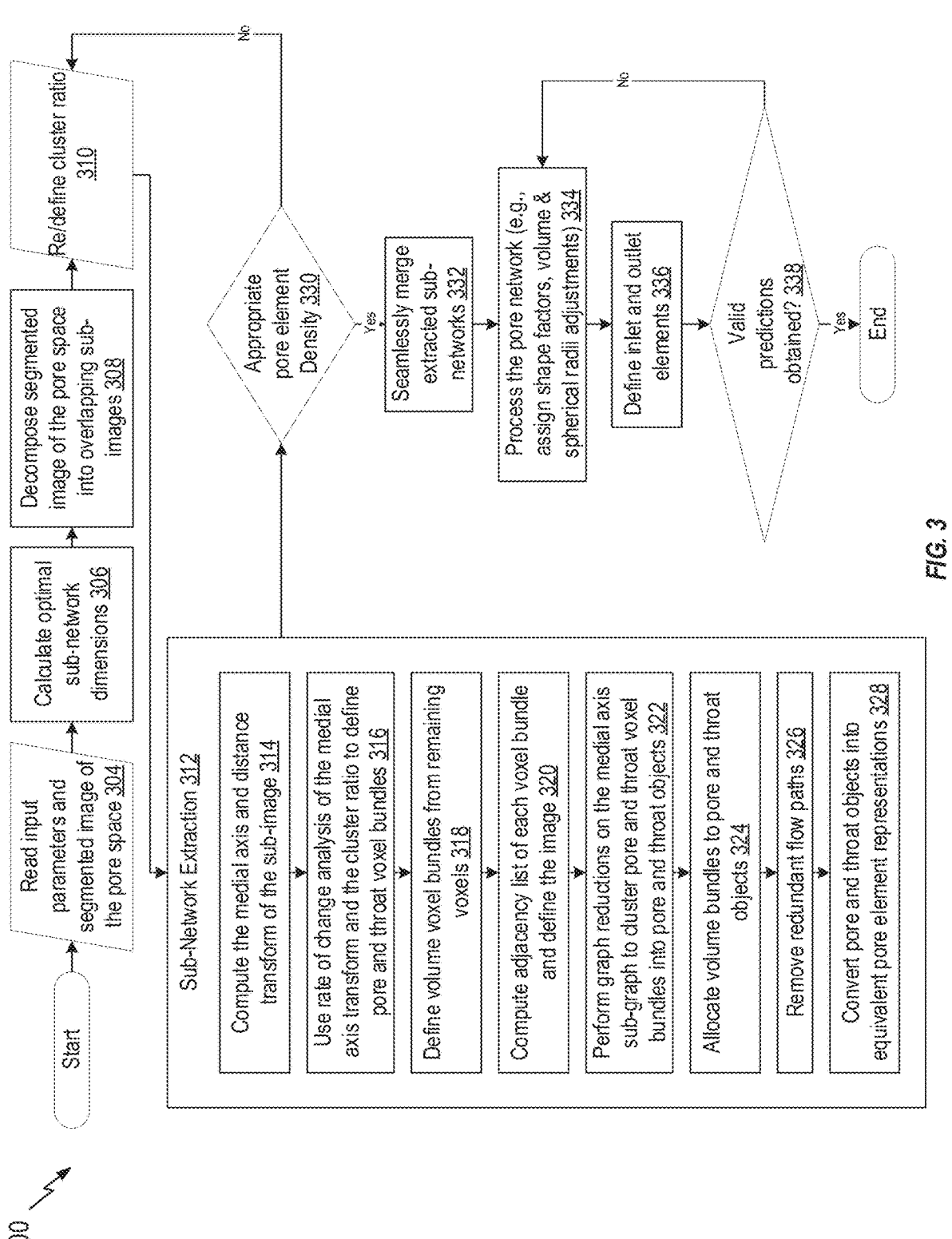
FIG. 3 depicts an example pore network extraction procedure for characterizing of porous media by one or more central processing units (CPU).

A flow chart illustrating an example seamless pore network extraction procedure 300 is provided in FIG. 3. At operation 304 of the seamless PNE procedure, one or more processors (e.g., one or more CPUs or one or more GPUs) read input parameters and a segmented global image of a pore space. The processors calculate optimal sub-network dimensions of the global image at operation 306. The global image may decomposed into a set of overlapping subimages by the one or more processors at operation 308. At 310 the processors define a cluster ratio for the set of subimages, from which a set of corresponding subnetworks are extracted in parallel at operation 312 and seamlessly merged at operation 332 into subnetworks to obtain a cohesive representative description of the imaged porous media. At 312, processors begin sub-network extraction. During the sub-network extraction 312, the processors may implement a graph and medial axis transform driven PNE procedure 314 to transform each subimage. This may guarantee consistency of these subnetworks over each region of overlap and is a vital step that allows adjacent subnetworks to be seamlessly merged.

The processors may define two fundamental characterizations of the digital image: the distance map and the medial axis. The distance map (or distance transform) of an image is a map that assigns to each voxel of the image its distance to the nearest voxel of a different type. In some cases, the distance map may describe the distance of a voxel of the void space to its nearest rock matrix voxel. Often, the medial axis of a region is the set of all voxels for which its distance map value may be defined by more than one voxel of the image boundary. The medial axis may consist of voxels of the void space that represent the centers of spheres that are tangential to the pore-rock boundary at a minimum of two points. Computation of each medial axis may perform using a binary thinning procedure or a watershed segmentation feature, and the distance map may be determined using a signed Maurer distance transform.

At 316, the one or more processors may apply rate-of-change analysis to the medial axis transform (e.g., a projection of the distance map onto the medial axis) to identify voxels along the medial axis that likely lie within pore bodies of the void space. Specifically, the rate of change of the medial axis transform may be evaluated to identify local maximums. The void space around the medial axis is decomposed into a set of voxel bundles (e.g., collections of neighboring voxels within an adjusted spherical radius of a seed voxel) that represent components of either pore body or pore throat objects. Then, at 318, the processors collect remaining voxels of the void space into volume bundles that are later distributed to the pore body and pore throat objects of the subnetwork. At 320, the processors compute the connectivity between each voxel bundle, and define an image graph consisting of pore, throat, and volume bundles from their adjacency lists. At 322, the processors perform local analysis of each voxel bundle to reduce the size of the image graph and define distinct pore bodies and pore throat elements. Afterwards, the processors may derive the morphological properties (e.g., shape factor, volume, clay content, etc.) of each pore element of the subnetwork from their defining voxel image.

At 324, the processors define pore and throat voxel bundles along the medial axis, while constructing volume voxel bundles near the surface of the pore space. These voxel bundles may be regarded as the building blocks of the extracted pore network since they constitute the vertices of the image graph, an undirected graph whose edges indicate that the surface of two voxel bundles share at least one common face. The image graph may be stored in the form of adjacency lists. The medial axis subgraph may be used to refer to the subgraph of the image graph that consists of its pore and throat voxel bundles (e.g., excluding the volume bundles of the image graph).

At 326, the processors remove redundant flow paths. At 328, the processors convert pore and throat object into representational pore elements. After sub-network extraction 312, the processors determine whether the extracted sub-network has appropriate pore element density at 330. If the extracted sub-network does not have appropriate pore element density, the processors re-define a cluster ratio at 310, and re-start sub-network extraction 312. If the extracted sub-network has appropriate pore element density, the processors seamlessly merge all extracted sub-networks at 332. At 334, the processors assign shape factors, adjust volume and spherical radii, and perform any other processing steps suitable for generating a robust pore network. At 336, the processors define inlet and outlet elements. At 338, the processors determine whether valid predictions are obtained by the procedure 300. If valid predictions are not obtained, the processors repeat step 334. If valid predictions are obtained, the procedure 300 ends and outputs a cohesive pore network.

Figure 14:
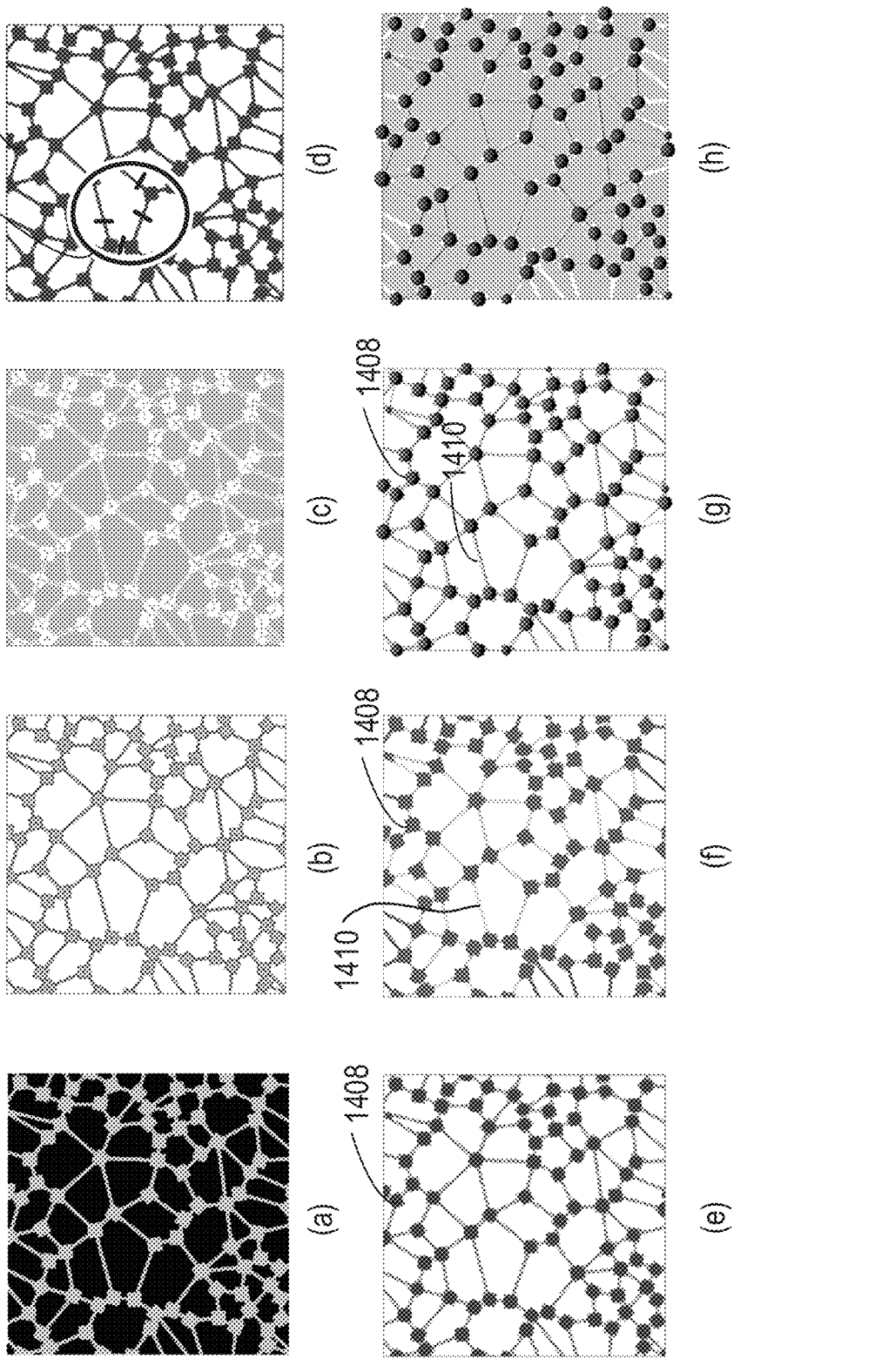
FIG. 14 depicts example two-dimensional (2D) images illustrating steps of an applied watershed enhanced pore network extraction workflow, performed according to certain aspects of the present disclosure.
Figure 15:
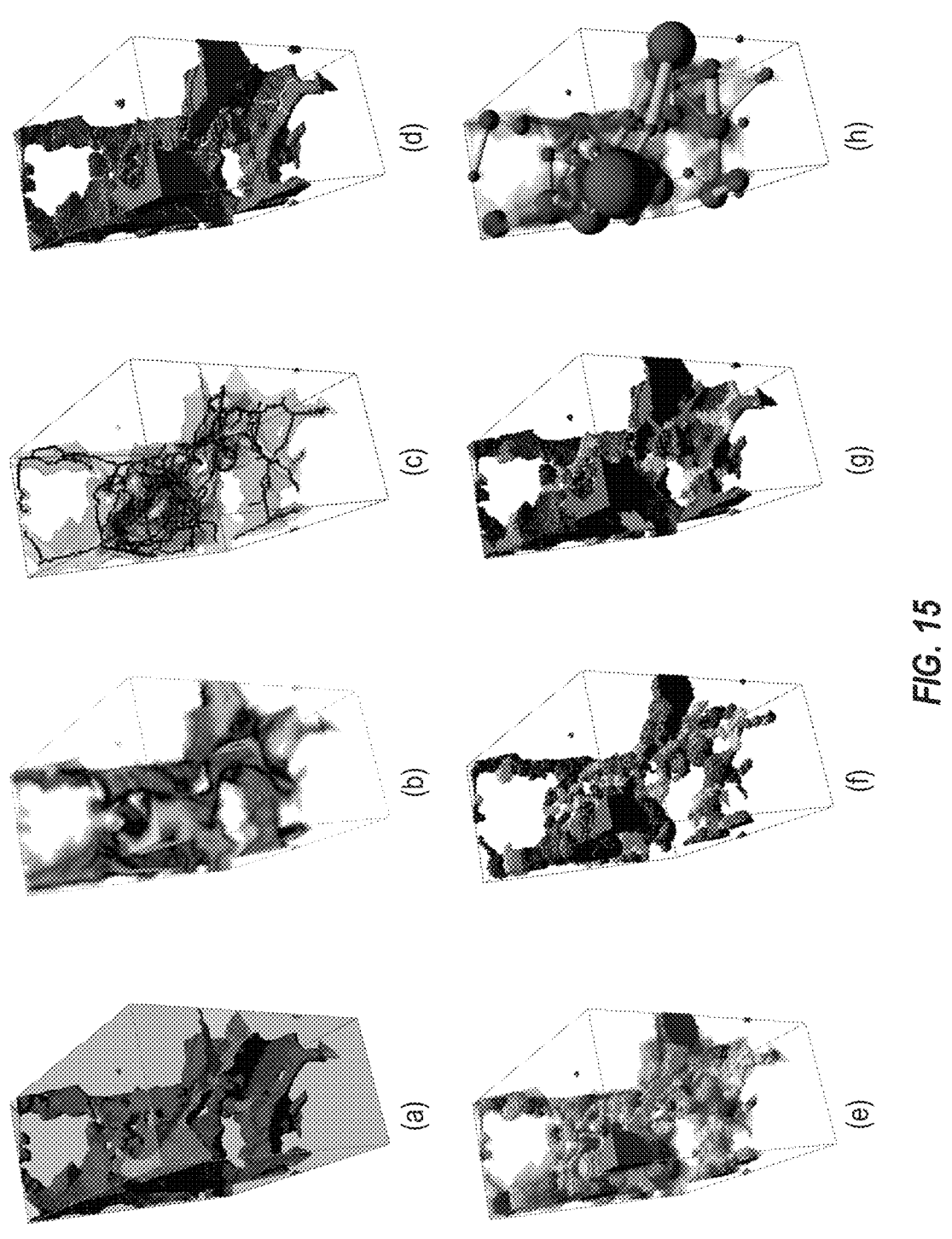
FIG. 15 depicts example three-dimensional (3D) images illustrating steps of an applied watershed enhanced pore network extraction workflow, performed according to certain aspects of the present disclosure.

In some cases, one or more processor may implement a watershed enhanced pore network workflow as part of a network extraction process. The watershed enhanced pore network workflow, which is illustrated in the example of FIG. 14 and FIG. 15, may begin with image analysis of the segmented micro-CT image performed by one or more processors, during which a distance map and a medial axis of the image may be computed. During subsequent decomposition, the processors may apply a watershed segmentation routine to decompose the image into pore labels (e.g., distinct basins) and their interfaces (e.g., ridges). The processors may use the centers of each pore label to define the initial pore body bundles in the image graph, while the interface elements may be used to define the pore throat bundles. The cluster ratio may be adaptively chosen based on the distance between the pore label and its nearest interface. The processors may then use unclaimed voxels from the medial axis to define the medial axis bundles of the image graph, completing the medial axis subgraph. The processors may have remaining voxels serve as seed voxels for the volume bundles, representing the surface roughness of the image.

FIG. 14 depicts example 2D images illustrating steps of an applied watershed enhanced pore network extraction workflow. At (a), a segmented micro-CT image showcasing the intricate details of the micro-model is illustrated. At (b), a distance map illustrating the spatial information may be derived from the micro-CT image. At (c), a medial axis of the micro-CT image is illustrated, revealing the central pathways within the image. At (d), watershed segmentation results are shown, showcasing distinct labels 1402 and their interfaces (not visible, extrapolated interfaces are circled at 1404). At (e), the computed image graph is illustrated alongside a decomposition of the void space into pore bodies 1408, pore throats (not visible), medial axes (not visible), and volume voxel bundles (not visible). At (f), voxel classifications defining the pore network after reducing the image graph into pore bodies 1408 and throat elements 1410 are illustrated. At (g), an overlay of ball and stick representations is illustrated, highlighting pore bodies 1408 and throat elements 1410 along with their corresponding allocated voxels. At (h), a ball and stick representation of the extracted pore network is illustrated, juxtaposed with the micro-CT image of the micro-model.

FIG. 15 depicts example 3D images illustrating steps of an applied watershed enhanced pore network extraction workflow, as applied to samples of Berea Sandstone. Images (a) through (h) of FIG. 15 may be considered as analogous to images (a) through (h) of FIG. 14.

To reduce the size of the medial axis subgraph and define the centers of each pore body and throat element, the one or more processors may employ a series of decision-making rules. During this step, medial axis bundles are either clustered with neighboring pore elements or converted into pore body and pore throat elements. After refinement according to the decision-making rules, the pore and throat objects of the medial axis subgraph are well defined in the sense that each pore throat object connects exactly two pore body objects and represents a constriction of the void space. Once the medial axis subgraph is reduced, the processors perform an inflation step to cluster volume bundles and allocate their voxels to each pore element. Finally, the processors analyze the computed voxel image of each pore element and compute their geometric properties, such as spherical radius, volume, and shape factor, to define each element of the pore network.

To define each voxel bundle as described in the example of FIG. 3, the one or more processors may implement the following inflation process. The one or more processors may begin by identifying a seed voxel, as described in greater detail below. After a seed voxel has been selected, its spherical radius, $R_s$, is read from the computed distance map. Multiplying the spherical radius by the user defined adjustment coefficient, $\delta$, the processors may obtain the search radius, $\rho$, for the voxel bundle ($\rho = \delta \cdot R_s$). In one non-limiting example, the processors may assess a total of about 26 neighboring voxels, including about 6 lateral, about 12 diagonal, and about 8 diametrical, of the seed voxel for inclusion in the voxel bundle. A voxel is added to the voxel bundle only if it is not already part of a voxel bundle and its center is within the search radius of the defining voxel. This inflation process may be repeated for each added voxel, until no more voxels are available to add to the bundle. By the end of the inflation process, no isolated pockets of voxels are present in the voxel bundle. Furthermore, every voxel bundle inherits two key properties from its seed voxel: the spherical radius and the center location.

Construction of the image graph may begin with the assembly of the medial axis subgraph via a medial axis construction procedure. The medial axis construction procedure uses local geometry of pore spaces to maintain geometric consistency across regions of sub-image overlap. The medial axis construction procedure is a graph-based approach that uses a medial axis transform to extract subnetworks that may be seamlessly merged. The medial axis procedure proceeds by generating and analyzing a medial axis subgraph and performing graph reductions to cluster and reclassify pore and throat bundles into pore and throat objects.

Figure 5:
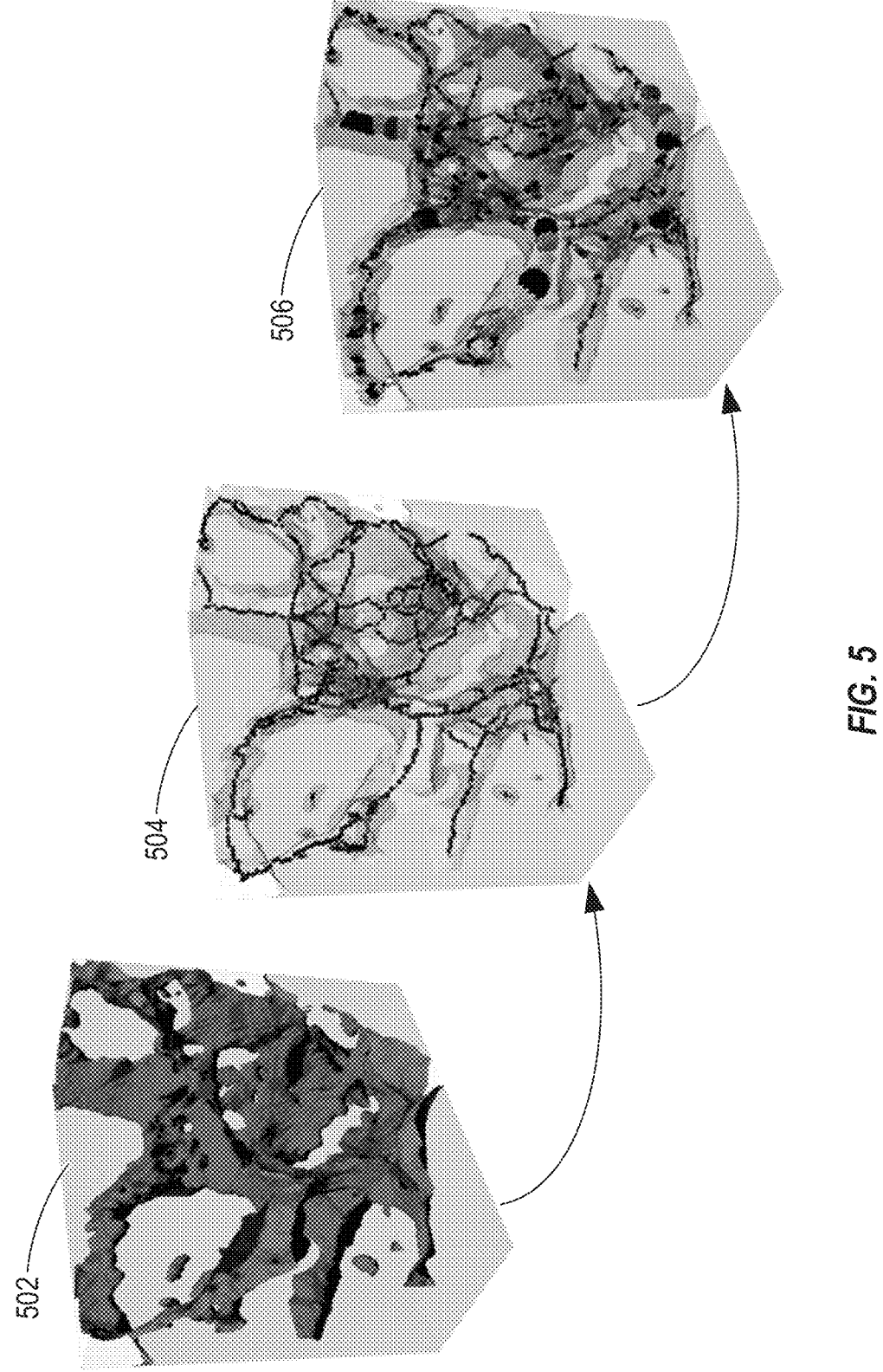
FIG. 5 depicts example outputs from a sub-network extraction procedure, according to aspects of the present disclosure.
Figure 6:
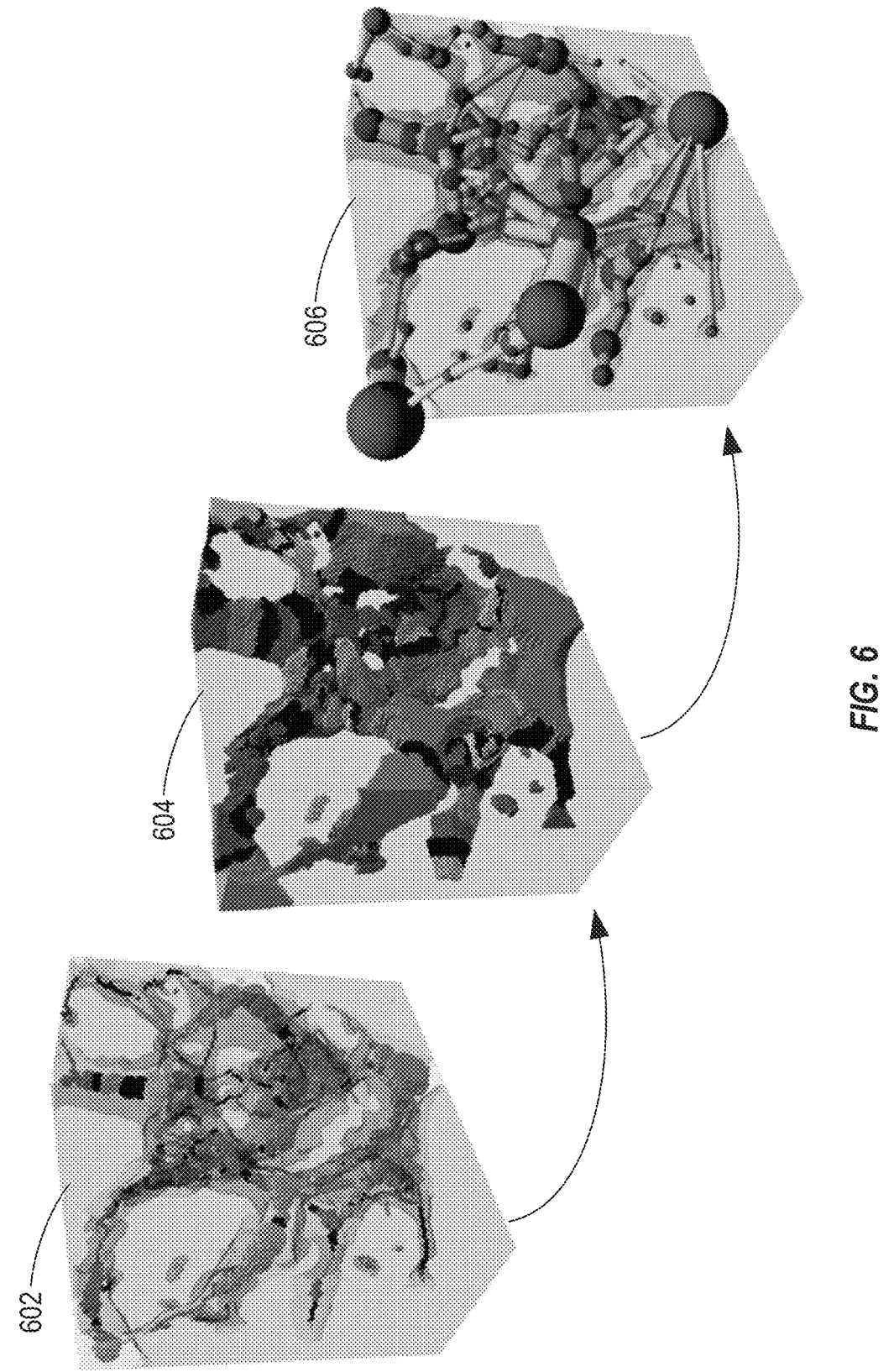
FIG. 6 depicts example outputs from a sub-network extraction procedure, according to aspects of the present disclosure.

FIG. 4 illustrates an example output 400 for the first step of a medial axis construction procedure. In some cases, the media axis construction procedure may be considered a sequence of graph reductions performed on the medial-axis subgraph. FIG. 5 illustrates example outputs for the intervening steps of the medial axis construction procedure, as performed on a segmented CT-image 502 of an example sandstone rock. FIG. 5 illustrates example outputs for the intervening steps of the medial axis construction procedure, as performed on a segmented CT-image 502 of an example proppant rock. FIG. 6 illustrates a section of the pore and throat elements that may be derived from the results of the medial axis procedure.

To define the medial axis subgraph, the processors first decompose the medial axis into a collection of edges 402 as shown in FIG. 4 and in 504 of FIG. 5, (e.g., strings of medial axis voxels that have exactly two neighboring medial axis voxels). Each edge may represent the connection between either the endpoints of the medial axis or one of its vertices. Because voxels that are not part of an edge represent either a junction or endpoint, they may be classified as potential pore voxels. Then, each edge of the medial axis may be traversed and the gradient of the distance map along the edge may be computed. Using the first derivative test, the processors identify all voxels of the edge that represent a local maximum and classify them as potential pore voxels. Any voxel of the medial axis that does not represent a local maximum may be classified as a potential pore throat voxel.

Sequentially, the processors define pore, throat and volume bundles using the voxel classifications obtained from the analysis of the medial axis. For each voxel bundle classification, seed voxels may be selected in order from largest to smallest distance map value. First, the potential pore voxels identified by analyzing the medial axis transform may be used as seed voxels to construct the pore bundles of the image graph. Afterwards, any unclaimed voxels along the medial axis may be used to define throat bundles. Alternatively, this procedure could be conducted on throat voxels before pore voxels, especially if pore labels and interfaces are obtained from watershed image processing. At this point, the image subgraph consisting entirely of pore and throat bundles constructed along the medial axis of the image, as illustrated in 506. To complete the image graph, volume bundles are constructed around any unclaimed voxels of the void space. The resulting image graph consists of a multiplicity of voxel bundles that are eventually clustered to obtain the pore network.

According to certain aspects of the present disclosure, the processors may analyze a medial axis subgraph analyzed and perform a series of graph refinements to cluster and reclassify pore and throat bundles into pore and throat objects. In other words, in this step of the extraction process, the vertices of the medial axis subgraph are converted into graph objects that represent clustered voxel bundles. In some cases, a sub-routine may check for inaccuracies in the medial axis transform such that it adaptively coverts throat objects to pore objects.

There are two operations that may be implemented to refine the pore and throat object assignment. First, processors may implement object reclassification and clustering. Object reclassification describes the process of re-assigning the designation of a given object (e.g., redefining a throat bundle as a pore bundle and vice versa). Object clustering describes the process of combining two objects by removing one of them from the image graph after adding both its adjacency list and voxels to the remaining object. Two objects may be neighbors if they are elements of each other's adjacency lists. To identify neighboring objects, a breadth first search (BFS) is performed on their adjacency lists to determine the local connectivity information. In one example, if a throat bundle is larger than its neighbors, it is reclassified as a pore bundle to ensure that throat bundles represent connections between wider sections of pore space.

Throughout these refinement steps, the one or more processors emphasize appropriately identifying potential pore throats of the pore network. In general, the pore throats of a pore network represent regions between pore bodies and thus, restrict the capacity for fluid flow through the pore space. To this end, the processors may place emphasis on accurately identifying throats of the pore network. In one example, accuracy is facilitated by defining a rule that emerging throat element represent a connection between exactly two pores. In one example, accuracy is facilitated by defining a spherical radius of a throat to be less than its associated pores. Neither of these constraints are imposed while constructing the initial image graph, where the focus was on defining pore bundles based on the gradient of the distance map.

Before analyzing the throat bundles of the medial axis subgraph, the one or more processors may cluster any pore bundles that are neighbors, since a clearly defined throat cannot be formed between them. When clustering two pore bundles with different spherical radii, the one with the largest radius is preserved. Additionally, this clustering procedure is continuously repeated after each step of the proceeding throat refinement process. This ensures a meaningful comparison between the spherical radii of neighboring objects while defining throat objects.

To define throat objects, the one or more processors apply the following refinement steps to the medial axis subgraph. If a throat bundle has no neighboring pore objects and has a spherical radius that is larger than or equal to its neighboring throat bundles, it is reclassified as a pore bundle. This ensures that the remaining throat bundles are direct connections between wider sections of the pore space. All throat bundles with a spherical radius that is larger than those of their neighboring pore objects are converted to pore bundles. Thus, each remaining throat bundle represents either a constriction, or a region of similar width, within the pore space. In this step, neighboring throat bundles may be clustered into potential throat objects by imposing that each throat bundle connects precisely two pore objects. To this end, the processors may compare the adjacency lists of neighboring throat bundles. In certain cases, two neighboring throat bundles are clustered if their adjacency list contains less than two pore objects or if they are connected to the same two pore objects.

During medial axis construction, the processor may generate artificial dead-ends along the medial axis that do not contribute to the flow properties of the imaged medium. To identify and remove throat objects defined along these dead ends, the one or more processors perform a BFS through the volume bundles in each throat's adjacency list. If a throat bundle has a neighboring volume bundle that is also connected to two pores associated with the throat object, then all four objects are clustered. In this way, if a direct path between neighboring pores exists that is outside of the medial axis, then their pore-throat chain is clustered.

If a throat bundle and its neighboring pore objects have equal spherical radii, all three objects may be clustered. This ensures that every throat object represents a proper constriction of the void space.

To certify proper connectivity of the network, the processors may reclassify any throat objects with more than two pore objects in its adjacency list as a pore bundle and subsequently cluster them with their neighboring pore objects. By doing this, each remaining throat object lies between exactly two pores.

After the above refinement steps, the pore and throat objects of the medial axis subgraph are well defined in the sense that each throat object connects to exactly two pore objects and represents a constriction of the void space. An example of a refined medial axis subgraph is illustrated in 602 of FIG. 6.

According to certain aspects of the present disclosure, the processors may distribute volume bundles of the image graph to the pore and throat objects of the medial axis subgraph using the following iterative procedure. First, the adjacency list of each pore object may be checked to identify any connected volume bundles. If a pore object is the only element of the medial axis subgraph that neighbors a voxel bundle, then they are clustered together. A similar process may be performed to inflate the throat objects, as illustrated in 604 of FIG. 6. In certain cases, a selected volume bundle may be clustered if it neighbors the same two pore objects as its neighboring throat object. This process of distributing volume bundles to pore and throat objects may be continued until no more volume bundles can be clustered according to these guidelines.

At this point, some unclassified volume bundles representing surface roughness, isolated pores, or unclassified connectivity information may remain within the image graph. To assign these volume bundles to the network, the one or more processors may evaluate their adjacency lists to conduct a reclassification operation. Specifically, if a free volume bundle is found to be in contact with two pores, then it may be reclassified as a throat bundle because it represents a connection between these pore objects that was not resolved by the medial axis. If a volume bundle has more than two neighboring pore objects, then every object, except the two pore objects with the shortest Euclidean distance from its center, are removed from its adjacency list. The processors then repeat portions of the pore throat clustering process and cluster them with their neighboring throat objects. Afterwards, any remaining volume bundles represent only the local storage capacity of the medium and have no contribution to the connectivity of the pore spaces. In view of this, the processors may check the adjacency list of each remaining voxel bundle and either cluster it with its nearest neighbor or reclassify it as a pore object if it is not in contact with any other objects. At the end of this process, every vertex of the image graph represents either a pore body or pore throat object. An example result of the medial axis transform procedure, defining pores and pore throats, is illustrated in FIG. 4. Another example result of the medial axis transform procedure, defining pores and pore throats, is illustrated in 606 of FIG. 6.

After the volume bundles of the image graph have been distributed to the pore bodies and pore throats, a reasonable network representation of the pore space has been obtained by the one or more processors. In some cases, the current structure of the network representation may contain a small but notable set of unessential pore bodies and flow paths. Since the segmented micro-CT digital image is a discrete representation of the pore space, a degree of irregular surface roughness in the image will be present. Consequently, it may be possible for the processors performing network extraction to generate excessive pores along the rock surface. Furthermore, the throat object clustering procedure may remove any artificial dead-ends and pore-throat chains with matching radii. However, the processor may not have made an attempt to remove any cycles, or groupings, of similarly sized pores within the network. To remedy this, the processors may perform additional graph reduction steps to decrease the number of pore elements of the network. The extent of this final graph refinement step depends on a user defined estimate of the discretization error of the image, $\epsilon$. For the networks used in this PNE procedure, $\epsilon$ may be chosen to be the same value as the resolution of the image.

The one or more processors may use the following steps to identify and remove these redundant flow paths. The processors first aim to remove artificial dead-end pores that can result from surface roughness within the image. Specifically, if a pore object has an assigned spherical radius that is less than $\epsilon$ and a coordination number of one, then that pore-throat chain is clustered with its neighboring pore object.

The next graph reduction focuses on removing pore-throat chains with similar sizes. For instance, if the differences in spherical radii between a pore throat object and both of its neighboring pore objects are less than $\epsilon$, then they are clustered together.

The one or more processors use the following process to handle any cycles, or groupings, of similarly sized pores within the network. Let $P_i$ and $P_j$ be two pores that are connected by a throat object. If the differences in spherical radii between $P_i$ and $P_j$ and their shared throat object is less than $2\epsilon$, the one or more processors may use a BFS to identify the additional pore objects with which $P_i$ and $P_j$ share pore throats. In some cases, $S_i$ and $S_j$, may represent the set of pore objects for which a shared pore throat between $P_i$ and $P_j$ exist, respectively. If $S_i \cap S_j = S_j \backslash P_i$ or $S_i \cap S_j = S_i \backslash P_j$, then $P_i$ and $P_j$ are clustered together and their attached pore throat objects are combined accordingly.

At this point of the PNE procedure (e.g., procedure 300 of FIG. 3), the voxel representation of the pore space has been decomposed into pore and throat objects. Pore objects may be defined as pore bodies and throat objects may be defined as pore throats since each vertex of the image graph now represents a distinct element of the extracted pore network. The geometric properties of each pore element may be derived using the following analysis of their associated component voxels.

According to certain aspects, the one or more processors may define the center of each pore element as the average value of their component voxels' positions. Since the medial axis is defined using points that are equidistant to the boundary of the pore space, the distance map values along the medial axis may not always correspond to the largest values of the distance map within the pore space. Thus, the spherical radius of each pore body may be set to be the largest distance map value associated with its component voxels, regardless of whether they are part of the medial axis. In contrast, the spherical radii of pore throat elements are defined using the largest distance map value that lies along the medial axis, rather than the largest value assigned to the pore throat element's component voxels. If the medial axis does not intersect with the pore throat element (e.g., if the pore throat element was defined during the distribution of volume bundles), then the largest distance map value for its defining voxels may be used instead. FIG. 1A illustrates the resulting position and size of each pore element within the pore space, as depicted in an overlay of a computed subnetwork on its corresponding segmented micro-CT image.

In some cases, the outputs of the signed Maurer distance transform may be integer values representing the square of the voxel's spherical radius, with a value of zero representing surface voxels in the lateral sense. To convert these discrete values into continuum scale estimates of the spherical radius, the one or more processors may compute their square root and add a small statistical offset to the estimate. For this offset, the processors may choose to use a random number obtained from a uniform distribution with a support of $$\frac{1}{2}$$

and $\sqrt{3}$ times the image's resolution.

To classify the shape factor of each pore element, the processors may apply a filtering technique based on sphericity, a measure of an object's roundness, to determine the elements type prior to the estimation of the shape factor. The sphericity of an object may be calculated according to the following equation:

$$S(V, A) = \frac{\pi^{\frac{1}{3}} (6V)^{\frac{2}{3}}}{A}.$$

If the sphericity is sufficiently close to either a sphere or a cube, then the one or more processors may assume that its cross section is circular or square, respectively. Otherwise, the objects cross section is assumed to be triangular and assigned a shape factor according to the following equation:

$$G = \frac{VL}{A^2}$$

where L is twice the Euclidean distance between the object center and its farthest voxel in the voxel bundle.

The one or more processors may assign the characteristic lengths associated with each pore throat element. Specifically, for a pore throat element connecting pore bodies $P_i$ and $P_j$, the one or more processors may compute $$l_i'$$

and $$l_j',$$

the Euclidean distance between the pore throat elements center and the center of $P_i$ and $P_j$, respectively. Then, using a pore-pore throat segmentation coefficient, a, the pore lengths $l_i$ and $l_j$ may be defined according to the following:

$$l_i = l_i'\left(1 - \alpha\frac{r_t}{r_i}\right) \text{ and } l_j = l_j'\left(1 - \alpha\frac{r_t}{r_j}\right)$$

where $r_i$ and $r_j$ are the radii of pore bodies $P_i$ and $P_j$, and $r_t$ is the spherical radius of the pore throat element. In some cases, the processors may be set $\alpha$ to be 0.6 and 0.7 for various networks representing various porous media samples, respectively. These values of $\alpha$ may be chosen based on absolute permeability estimates of conventional-sized networks constructed. In some cases, the choice of these values may have a moderate impact on the absolute permeability estimates of the extracted networks, and no observable impact on the relative permeability curves obtained from quasi-static models.

To account for outstanding inaccuracies in the output of the PNE procedure, the one or more processors may perform a correction, where the processors redistribute portions of the volume from pore bodies to their neighboring pore throat elements. The extent of volume redistribution is weighted with respect to their pore throat lengths. In this way, the volume of the network associated with pore throat elements between distant pore bodies is increased and thus, their effect on saturation calculations may be more prominent. After this correction step, close to half of the total pore volume of the generated pore network may be attributed to its pore throat elements. Lastly, the processors remove any isolated pore bodies with negligible volumes that may be attributed to noise within the micro-CT image.

In certain cases, clay content within a porous medium may be an important parameter within the PNE procedure, since it controls the amount of water within the porous media that is immobile. Depending on the type of segmentation performed, there may be two approaches that can be used to assign clay content to each pore element. If the segmentation process explicitly identifies clay voxels within the micro-CT image, they can be clustered with the constitutive voxels of each pore element to determine its clay content. If this information is unavailable after segmentation, then it can be stochastically distributed based on the irreducible water saturation obtained at the end of primary drainage. Specifically, if the void volume percentage of the original image matched the desired final porosity, then a small percentage of each pore element's void space volume is converted to clay content. The exact value of this translation may be computed by multiplying the current void space volume of each element by the desired clay content percentage and applying a small statistical offset. If the desired final porosity is larger than the void space volume available in the image, then additional clay content may be added to each pore element using its volume contribution to the entire network as a weighting parameter.

Since each subnetwork is obtained through a sequence of graph reductions, guided entirely by local geometric properties without involving global topological features of the overall pore space, their local structures are consistently generated by the one or more processors. In other words, if this method is applied to both an image and a sufficiently large subsection of that image, then the smaller network will be a subset of the larger network. In a similar fashion, if networks are extracted from overlapping images, their local structures will match in the region of overlap, as in FIG. 6. Therefore, the PNE procedure allows the processors to obtain subnetworks for different segments of a porous media sample and later seamlessly integrate them into a complete pore network.

Although the amount of overlap can be dictated based on available computational resources for each subnetwork extraction, the size of this region may be chosen by the one or more processors based on one or more parameters. For instance, the overlap region may clearly resolve a reasonable amount of the pore bodies that it contains. Otherwise, since the boundary of an image cuts through pore bodies, it is unlikely for two neighboring subnetworks to represent them at the same locations with the same properties, leading to inconsistencies during the merging step. To alleviate this problem, the processors impose that the length of the overlapping region is significantly larger than typical pore body radii, and merge adjacent subnetworks along the mid-plane of their region of overlap.

FIG. 7 illustrates an example network 700 extracted from micro-CT images of a miniature core sample of a sandstone. Using a selected overlap 702 of the micro-CT images length as a guide, the original segmented micro-CT image may be decomposed into a set of $N_x \times N_y \times N_z$ cuboids, where $N_i$ represents the number of subimages in direction i. An associated set of subnetworks may be then obtained using the PNE procedure applied to each subimage. In this sense, the PNE procedure may be considered parallel, while the extraction of each subnetwork may be considered independent. After each subnetwork is extracted, the one or more processors first merge subnetworks in a manner that forms slices along the longitudinal axis. Then, starting from the inlet side of the pore network, the processors merge every overlapping slice together to generate the final global network. An example overlapping slice set is illustrated by duplicative sections 704 that are present in overlapping example slices.

In some cases, $N_a$ and $N_b$ may represent two subnetworks that overlap along the direction i and, without loss of generality. $N_a$ may have more elements that $N_b$. To merge these two subnetworks, the one or more processors may first identify the midpoint of their region of overlap in the direction of i. Because each subnetwork is cubic in shape, the plane perpendicular to i and centered at this midpoint represents the mid-plane of the region of overlap. After the mid-plane has been identified, the pore bodies and pore throat elements of $N_a$ can be divided into two sets depending on the side of the midplane that they are located. The processors first populate the seamlessly merged network, $N_s$, with all pore bodies and pore throat elements of $N_a$ that define the larger of these two sets. Then, if a pore throat element of $N_a$ crosses the mid-plane, it is added to $N_s$ and the position and spherical radius of its attached pore body that was not added to $N_s$ is stored. Next, all pore bodies and pore throat elements of $N_b$ that lie on the opposite side of the mid-plane are then added to $N_s$. The pore throat elements of $N_s$ that cross the midplane and are then attached to appropriate pore bodies of $N_s$ that came from $N_B$. For this, the stored position of the missing pore body is used as a reference, and the element of $N_s$ that is the closest to it is attached to the pore throat element. If the distance between the center of these pore bodies is larger than the spherical radius, the processors regard the extraction process as a non-convergent since the region of overlap is likely too thin and in need of an increase. Moreover, with respect to these small variations, the pore throat lengths of these pore throats are recomputed using method described herein.

Pore bodies and pore throat elements defined along the surface of the image may be smaller than, and less reflective of, the internal pore space of the medium. Ending slices of the micro-CT images tend to cut through pore spaces of the medium. In implementing the PNE procedure (e.g., procedure 300 of FIG. 3), the one or more processors may choose to remove these elements from the pore network to ensure that the boundary elements properly reflect the inherent topology of the porous medium. Inlet pore throats are determined by defining a mid-plane that is perpendicular to the longitudinal axis, and sufficiently far away from the inlet boundary of the image. Any pore throat element that intersects this mid-plane is classified as an inlet pore throat element, and all pore elements that lie between the inlet and this mid-plane are removed from the network. If more than one inlet pore throat element is attached to the same pore body, then the one with the largest spherical radius is kept. A similar process is used to define outlet pore throats.

Figure 8:
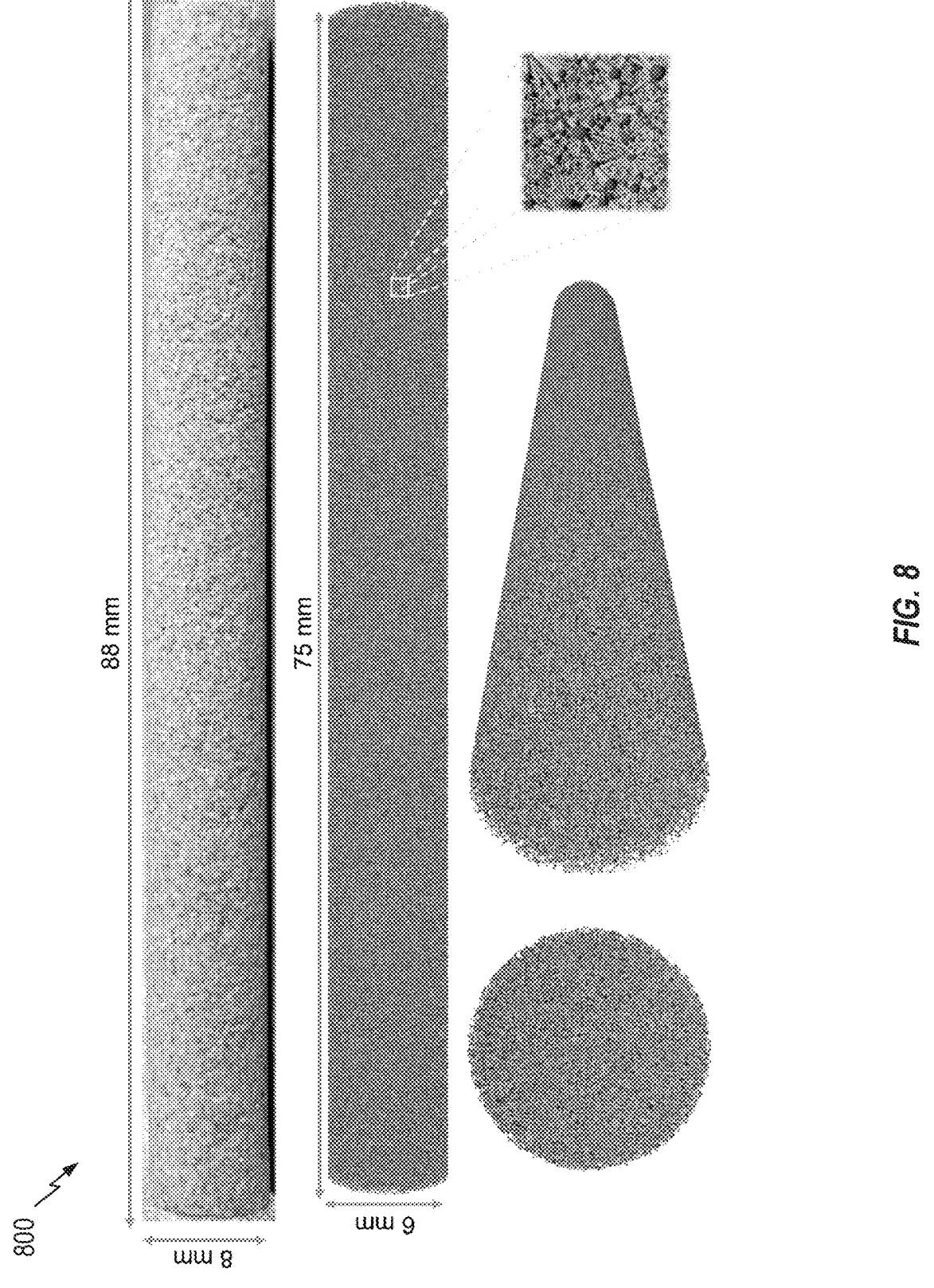
FIG. 8 illustrates an example network extracted from micro-computed tomography (micro-CT) images of a miniature core sample of a sandstone.

FIG. 8 illustrates an example network 800 extracted from micro-CT images of a miniature core sample of Bentheimer sandstone. Roughly 2.5 million pore bodies (red spheres) are connected by 5 million pore throats (blue cylinders). This network is in one-to-one correspondence with a physical domain that is 6 mm in diameter and 74 mm in length.

FIG. 9 depicts distributions of (a) coordination numbers and (b) aspect ratios for miniature core-sized pore networks extracted from high-resolution micro-CT images of Berea and Bentheimer sandstone rock samples.

FIG. 10 depicts distributions of (a) pore and (b) pore throat radii for miniature core-sized pore networks extracted from high-resolution micro-CT images of Berea and Bentheimer samples.

FIG. 11 depicts distributions of (a) pore spacing and (b) shape factors for miniature core-sized pore networks extracted from high-resolution micro-CT images of Berea and Bentheimer samples.

Characteristics of the extracted pore networks may be defined during extraction, and may encompass any of the following parameters: Porosity excluded clay percentage, porosity included clay percentage, absolute Permeability (millidarcies), length (millimeters), diameter (millimeters), minimum coordination number, maximum coordination number, average coordination number, minimum radius, maximum radius, average radius, triangular cross section percentage, square cross section percentage, pores connected to the inlets, and pores connected to the outlets.

In certain cases, the seamless PNE platform may be used to extract core-sized pore networks directly from segmented micro-CT images of porous media samples. Specifically, through analysis of the image's medial axis and distance map, the pore space is accurately and consistently be decomposed into distinct regions that represent constrictions to flow and the local storage capacity of the medium. Pore elements are defined using a sequence of reductions on a graphical representation of the voxel image. The image graph is constructed using the medial axis transform of the image to decompose the digital pore space into a disjoint set of voxel bundles. Conceptually, a voxel bundle shares many characteristics with maximal balls. In this sense, the PNE technique can be viewed as an integration of the maximal ball and the medial axis construction techniques.

Since each network is obtained through a sequence of graph reductions, guided entirely by local geometric properties of the pore space, their local structures are consistently generated. This allows for subnetworks to be extracted from overlapping subsections of micro-CT images that can be seamlessly integrated into a complete pore network. This approach is advantageous since the computational workload of the extraction process can be distributed across many computing processors in a trivial way. Consequently, the seamless PNE platform allows for the formulation of high-quality pore-scale models that are in one-to-one correspondence with samples used in laboratory experiments.

A balance between the computational cost of the seamless extraction method, and the complexity of the extracted network is provided through the adjustment coefficient. Since it dictates the size and volume of each voxel bundle, the adjustment coefficient represents the resolution of the initial representation of the void space as an image graph. If the adjustment coefficient is small, more fine-scale features of the pore space will be represented in the image graph.

The seamless PNE procedure may be applied to extract larger-sized pore networks directly from segmented, high-resolution micro-CT images of miniature core samples. This paves the way for the deployment of PNE technologies to tackle real-world applications.

Example Methods

Figure 13:
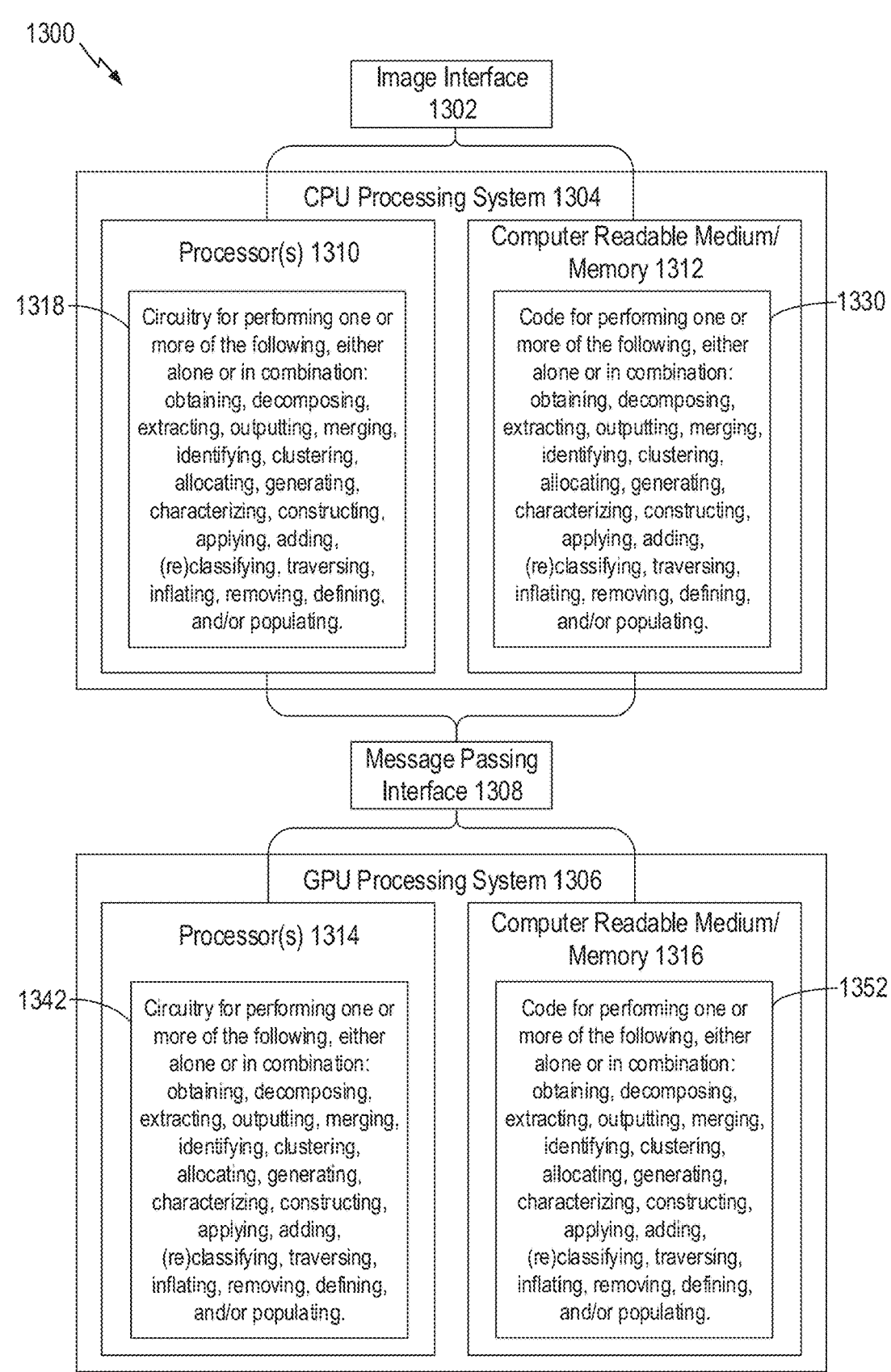
FIG. 13 is an example device for extracting pore networks.

FIG. 12 depicts a method 1200 for pore network extraction by one or more CPUs, such as the CPUs of the device 1300 of FIG. 13.

Method 1200 begins at 1202 with one or more CPUs obtaining a global image of a porous media sample. In some cases, the porous media sample may be a rock sample.

Method 1200 continues to step 1204 with one or more CPUs decomposing the global image into a set of overlapping subimages. In some cases, decomposing the global image into a set of overlapping subimages may include decomposing the global image into a set of pore labels and a set of interfaces.

Method 1200 continues to step 1206 with one or more CPUs extracting a set of subnetworks corresponding the set of overlapping subimages. In some cases, each of the set of overlapping subimages may include at least a distance map and a medial axis. In some cases, the distance map may assign, to each voxel of each of the set of overlapping subimages, a distance value equivalent to a nearest voxel having a different type. In some cases, extracting the set of subnetworks may include identifying a set of voxels along a medial axis that lie within a void space, wherein the void space contains one or more pore spaces, wherein the one or more pore spaces comprise at least one of pore bodies, pore throats, and volume voxel bundles, decomposing the void space to represent the one or more pore spaces, clustering the one or more pore spaces based on an association of each of the one or more pore spaces with the pore bodies, the pore throats, or the volume voxel bundles, allocating one or more of the volume voxel bundles to either the pore bodies or the pore throats, generating the set of subnetworks based on the pore bodies and the pore throats, and characterizing one or more properties of the set of subnetworks. In some cases, decomposing the void space to represent the one or more pore spaces may include constructing the pore body and the pore throat bundles along the medial axis, and constructing the volume voxel bundles adjacent to a surface corresponding to the one or more pore spaces. In some cases, constructing the voxel bundles may include identifying one or more seed voxels, applying spherical radius for each of the one or more seed voxels based on a distance map, applying an adjustment value to the spherical radius to obtain a search radius, and generating a voxel bundle based on at least the search radius. In some cases, generating the voxel bundle may include adding one or more target voxels to the voxel bundle, wherein the one or more target voxels are within the search radius and are not affiliated with another voxel bundle. In some cases, at least one of the pore throats may include a connection between two pore bodies having spherical radii larger than or equal to the at least one of the pore throats.

In some cases, decomposing the void space to represent the one or more pore spaces may include decomposing the medial axis into a set of edges, wherein each of the set of edges represents a connection between at least one of endpoints of the medial axis or vertices of the medial axis, classifying voxels that are not within the set of edges as part of a set of potential pore voxels, traversing each of the set of edges, and generating a gradient of a distance map along the set of edges. In some cases, decomposing the void space to represent the one or more pore spaces may include generating the set of potential pore voxels using at least a set of local maxima, generating a set of potential pore throat voxels using at least the set of local maxima, generating the pore bodies and the pore throats using at least the set of potential pore voxels and the set of potential pore throat voxels, generating the volume voxel bundles from a set of voxels not assigned to the pore bodies or the pore throats, and outputting an image graph comprising the pore bodies, the pore throats, and the volume voxel bundles.

In some cases, clustering the one or more pore spaces may include converting vertices of an image graph into a set of graph objects that represent a set of clustered voxel bundles, wherein converting may include reclassifying at least some of the pore throats and at least some of the pore bodies, and clustering at least two of the set of graph objects. In some cases, generating the set of subnetworks based on the pore bodies and the pore throats may include inflating a subgraph based on the medial axis, clustering neighboring objects within the subgraph, wherein the neighboring objects comprise at least some of the pore bodies and at least some of the pore throats, and outputting an image graph comprising the pore bodies and the pore throats. In some cases, characterizing one or more properties of the set of subnetworks may include generating a center and a spherical radius for each of the pore bodies, generating a length for each of the pore throats, classifying each of the pore bodies, each of the pore throats, or each of both according to a shape factor, and generating a volume for each of the pore bodies, each of the pore throats, or each of both. In some cases, the method may further include generating a clay content value for each of the pore bodies, each of the pore throats, or each of both. In some cases, clustering the one or more pore spaces may be based on an association of some of the one or more pore spaces to a set of clay bodies.

In some cases, extracting a set of subnetworks may include constructing, within a geometry corresponding to the one or more overlapping images, one or more pore bodies within voxels based on at least the set of pore labels, constructing, within the geometry, one or more pore throat bundles based on at least the set of interfaces, constructing, within the geometry, one or more or more medial axis bundles corresponding to one or more unclaimed voxels, the unclaimed voxels falling along a medial axis and being different than both the one or more pore bodies and the one or more pore throat bundles, and identifying, within the geometry, one or more seed voxels. In some cases, the one or more medial axis bundles may be reassigned to the one or more pore bodies, the one or more pore throats, or some combination of the one or more pore bodies and the one or more pore throats.

Method 1200 continues to step 1208 with one or more CPUs obtaining a cohesive network representative of the porous media sample by merging the set of subnetworks. In some cases, merging the set of subnetworks may include producing a seamlessly extracted pore network. In some cases, obtaining a cohesive network representative of the porous media sample may include defining an overlap region for the set of subnetworks, based at least in part on the set of overlapping subimages, based on the overlap region, decomposing the global image into a set of geometric shapes, merging the subnetworks based on the set of overlap regions to generate a merged pore network, populating the merged pore network with a set of pore bodies and a set of pore throats, and defining a set of inlet elements and a set of outlet elements within or ascribed to the set of pore bodies and the set of pore throats to generate the cohesive pore network. In some cases, the set of geometric shapes may include a set of cuboids.

Method 1200 continues to step 1210 with one or more CPUs outputting the cohesive pore network.

In some cases, method 1200 may further include removing redundant flow paths from the set of subnetworks.

In one aspect, method 1200, or any aspect related to it, may be performed by an apparatus, such as device 1300 of FIG. 13, which includes various components operable, configured, or adapted to perform the method 1200. Device 1300 is described below in further detail.

Note that FIG. 12 is just one example of a method, and other methods including fewer, additional, or alternative steps are possible consistent with this disclosure.

Example Device

FIG. 13 depicts aspects of an example porous media device 1300. In some aspect, the device 1300 comprises one or more CPUs, one or more GPUs, or both as described above with respect to FIG. 4.

The device 1300 includes a CPU processing system 1304 coupled to an image interface 1302 (e.g., a user interface or and/or an image generator such as a commercial micro-CT scanner). The CPU processing system 1304 may be configured to perform processing functions for the device 1300, including pore network extraction performed by the device 1300.

The CPU processing system 1304 includes one or more processors 1310. The one or more processors 1310 are coupled to a computer-readable medium/memory 1312 via a bus. The one or more processors 1310 and the computer-readable medium/memory 1312 may communicate with the one or more processor 1314 and the computer-readable medium/memory 1316 of the GPU processing system 1306 via a message passing interface (MPI) 1308. In certain aspects, the computer-readable medium/memory 1312 is configured to store instructions (e.g., computer-executable code) that when executed by the one or more processors 1210, cause the one or more processors 1310 to perform the method 1200 described with respect to FIG. 13, or any aspect related to it. Note that reference to a processor performing a function of device 1300 may include one or more processors performing that function of device 1300.

In the depicted example, computer-readable medium/memory 1312 stores code (e.g., executable instructions) 1330-1040 for performing techniques described herein, according to aspects of the present disclosure. Processing of the code 1330-1040 may cause the device 1300 to perform the method 1200 described with respect to FIG. 12, or any aspect related to it.

The one or more processors 1310 include circuitry configured to implement (e.g., execute) the code stored in the computer-readable medium/memory 1312, including circuitry 1318-1028 for performing techniques described herein, according to aspects of the present disclosure. Processing with circuitry 1318-1328 may cause the device 1300 to perform the method 1200 described with respect to FIG. 12, or any aspect related to it.

Various components of the device 1300 may provide means for performing the method 1200 described with respect to FIG. 12, or any aspect related to it.

The device 1300 includes a GPU processing system 1306. The GPU processing system 1306 may be configured to perform processing functions for the device 1300, and pore network extraction performed by the device 1300.

The GPU processing system 1306 includes one or more processors 1314. The one or more processors 1314 are coupled to a computer-readable medium/memory 1316 via a bus. The one or more processors 1314 and the computer-readable medium/memory 1316 may communicate with the one or more processor 1310 and the computer-readable medium/memory 1312 of the CPU processing system 1304 via an MPI 1308. In certain aspects, the computer-readable medium/memory 1316 is configured to store instructions (e.g., computer-executable code) that when executed by the one or more processors 1314, cause the one or more processors 1314 to perform the method 1200 described with respect to FIG. 12, or any aspect related to it. Note that reference to a processor performing a function of device 1300 may include one or more processors performing that function of device 1300.

In the depicted example, computer-readable medium/memory 1316 stores code (e.g., executable instructions) for performing certain functions according to aspects of the present disclosure 1352-1660. Processing of the code 1352-1360 may cause the device 1300 to perform the method 1200 described with respect to FIG. 12, or any aspect related to it.

The one or more processors 1314 include circuitry configured to implement (e.g., execute) the code stored in the computer-readable medium/memory 1316, including circuitry for performing certain functions according to aspects of the present disclosure 1342-1650. Processing with circuitry 1342-1350 may cause the device 1300 to perform the method 1200 described with respect to FIG. 12, or any aspect related to it.

Various components of the device 1300 may provide means for performing the method 1200 described with respect to FIG. 12, or any aspect related to it.

Example Aspects

Implementation examples are described in the following numbered clauses:

Aspect 1: A method for pore network extraction by one or more processing units, comprising: obtaining a global image of a porous media sample, decomposing the global image into a set of overlapping subimages, extracting a set of subnetworks corresponding to the set of overlapping subimages, obtaining a cohesive pore network representing the porous media sample by merging the set of subnetworks, and outputting the cohesive pore network.

Aspect 2; The method of aspect 1, wherein merging the set of subnetworks comprises producing a seamlessly extracted pore network.

Aspect 3: The method of any one of aspects 1 and 2, wherein each of the set of overlapping subimages comprises at least a distance map and a medial axis.

Aspect 4: The method of aspect 3, wherein the distance map assigns, to each voxel of each of the set of overlapping subimages, a distance value equivalent to a nearest voxel having a different type.

Aspect 5: The method of any one of aspects 1 through 4, wherein extracting the set of subnetworks comprises: identifying a set of voxels along a medial axis that lie within a void space, wherein the void space contains one or more pore spaces, wherein the one or more pore spaces comprise at least one of pore bodies, pore throats, and volume voxel bundles, decomposing the void space to represent the one or more pore spaces, clustering the one or more pore spaces based on an association of each of the one or more pore spaces with the pore bodies, the pore throats, or the volume voxel bundles, allocating one or more of the volume voxel bundles to either the pore bodies or the pore throats, generating the set of subnetworks based on the pore bodies and the pore throats, and characterizing one or more properties of the set of subnetworks.

Aspect 6: The method of aspect 5, wherein decomposing the void space to represent the one or more pore spaces comprises: constructing the pore body and the pore throat bundles along the medial axis, and constructing the volume voxel bundles adjacent to a surface corresponding to the one or more pore spaces.

Aspect 7: The method of aspect 6, wherein constructing the voxel bundles comprises: identifying one or more seed voxels, applying spherical radius for each of the one or more seed voxels based on a distance map, applying an adjustment value to the spherical radius to obtain a search radius, and generating a voxel bundle based on at least the search radius.

Aspect 8: The method of aspect 7, wherein generating the voxel bundle comprises adding one or more target voxels to the voxel bundle, wherein the one or more target voxels are within the search radius and are not affiliated with another voxel bundle.

Aspect 9: The method of any one of aspects 5 through 7, wherein decomposing the void space to represent the one or more pore spaces comprises: decomposing the medial axis into a set of edges, wherein each of the set of edges represents a connection between at least one of endpoints of the medial axis or vertices of the medial axis, classifying voxels that are not within the set of edges as part of a set of potential pore voxels, traversing each of the set of edges, and generating a gradient of a distance map along the set of edges.

Aspect 10: The method of aspect 9, wherein decomposing the void space to represent the one or more pore spaces comprises: generating the set of potential pore voxels using at least a set of local maxima, generating a set of potential pore throat voxels using at least the set of local maxima, generating the pore bodies and the pore throats using at least the set of potential pore voxels and the set of potential pore throat voxels, generating the volume voxel bundles from a set of voxels not assigned to the pore bodies or the pore throats, and outputting an image graph comprising the pore bodies, the pore throats, and the volume voxel bundles.

Aspect 11: The method of any one of aspects 5 through 10, wherein clustering the one or more pore spaces comprises converting vertices of an image graph into a set of graph objects that represent a set of clustered voxel bundles, wherein converting comprises: reclassifying at least some of the pore throats and at least some of the pore bodies, and clustering at least two of the set of graph objects.

Aspect 12; The method of any one of aspects 5 through 11, wherein at least one of the pore throats comprises a connection between two pore bodies having spherical radii larger than or equal to the at least one of the pore throats.

Aspect 13: The method of any one of aspects 5 through 12, wherein generating the set of subnetworks based on the pore bodies and the pore throats comprises: inflating a subgraph based on the medial axis, clustering neighboring objects within the subgraph, wherein the neighboring objects comprise at least some of the pore bodies and at least some of the pore throats, and outputting an image graph comprising the pore bodies and the pore throats.

Aspect 14: The method of any one of aspects 5 through 13, wherein characterizing one or more properties of the set of subnetworks comprises: generating a center and a spherical radius for each of the pore bodies, generating a length for each of the pore throats, classifying each of the pore bodies, each of the pore throats, or each of both according to a shape factor, and generating a volume for each of the pore bodies, each of the pore throats, or each of both.

Aspect 15: The method of aspect 14, further comprising generating a clay content value for each of the pore bodies, each of the pore throats, or each of both.

Aspect 16: The method of any one of aspects 5 through 15, wherein clustering the one or more pore spaces is further based on an association of some of the one or more pore spaces to a set of clay bodies.

Aspect 17: The method of any one of aspects 1 through 16, wherein obtaining a cohesive network representative of the porous media sample further comprises: defining an overlap region for the set of subnetworks, based at least in part on the set of overlapping subimages, based on the overlap region, decomposing the global image into a set of geometric shapes, merging the subnetworks based on the set of overlap regions to generate a merged pore network, populating the merged pore network with a set of pore bodies and a set of pore throats, and defining a set of inlet elements and a set of outlet elements within or ascribed to the set of pore bodies and the set of pore throats to generate the cohesive pore network.

Aspect 18: The method of aspect 17, wherein the set of geometric shapes comprises a set of cuboids.

Aspect 19: The method of any one of aspects 1 through 18, wherein decomposing the global image into a set of overlapping subimages comprises decomposing the subimage image into a set of pore labels and a set of interfaces.

Aspect 20: The method of aspect 19, wherein extracting a set of subnetworks comprises: constructing, within a geometry corresponding to the one or more overlapping images, one or more pore bodies within voxels based on at least the set of pore labels, constructing, within the geometry, one or more pore throat bundles based on at least the set of interfaces; constructing, within the geometry, one or more or more medial axis bundles corresponding to one or more unclaimed voxels, the unclaimed voxels falling along a medial axis and being different than both the one or more pore bodies and the one or more pore throat bundles; identifying, within the geometry, one or more seed voxels.

Aspect 21: The method of aspect 20, wherein the one or more medial axis bundles are reassigned to the one or more pore bodies, the one or more pore throats, or some combination of the one or more pore bodies and the one or more pore throats.

Aspect 22: The method of any one of aspects 1 through 21, further comprising removing redundant flow paths from the set of subnetworks.

Aspect 23: The method of any one of aspects 1 through 22, wherein the porous media sample comprises a rock sample.

Aspect 24: An apparatus, comprising means for performing a method in accordance with any one of Aspects 1-23.

Aspect 25: A non-transitory computer-readable medium comprising executable instructions that, when executed by a processor of an apparatus, cause the apparatus to perform a method in accordance with any one of Aspects 1-23.

Aspect 26: A computer program product embodied on a computer-readable storage medium comprising code for performing a method in accordance with any one of Aspects 1-23.

Aspect 27: An apparatus, comprising: a memory comprising executable instructions; and a processor configured to execute the executable instructions and cause the apparatus to perform a method in accordance with any one of Aspects 1-23.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, simulating, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing, decomposing, and the like.

The methods disclosed herein comprise one or more operations or actions for achieving the methods. The method operations and/or actions may be interchanged with one another without departing from the scope of the claims. In other words, unless a specific order of operations or actions is specified, the order and/or use of specific operations and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in the Figures, those operations may have corresponding counterpart means-plus-function components with similar numbering.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. A method for pore network extraction by one or more processing units, comprising:
    obtaining a global image of a porous media sample;
    decomposing the global image into a set of overlapping subimages;
    extracting a set of subnetworks corresponding to the set of overlapping subimages, comprising:
        identifying a set of voxels along a medial axis that lie within a void space, wherein the void space contains one or more pore spaces, wherein the one or more pore spaces comprise at least one of pore bodies, pore throats bundles, and volume voxel bundles; and
        generating the set of subnetworks based on the pore bodies and the pore throats bundles;
    obtaining a cohesive pore network representing the porous media sample by merging the set of subnetworks; and
    outputting the cohesive pore network.

2. The method of claim 1, wherein merging the set of subnetworks comprises producing an extracted pore network.

3. The method of claim 1, wherein each of the set of overlapping subimages comprises at least a distance map and a medial axis.

4. The method of claim 3, wherein the distance map assigns, to each voxel of each of the set of overlapping subimages, a distance value equivalent to a nearest voxel having a different type.

5. The method of claim 1, wherein extracting the set of subnetworks comprises:
    decomposing the void space to represent the one or more pore spaces;
    clustering the one or more pore spaces based on an association of each of the one or more pore spaces with the pore bodies, the pore throats bundles, or the volume voxel bundles;
    allocating one or more of the volume voxel bundles to either the pore bodies or the pore throats bundles; and
    characterizing one or more properties of the set of subnetworks.

6. The method of claim 5, wherein decomposing the void space to represent the one or more pore spaces comprises:
    constructing the pore body and the pore throat bundles along the medial axis; and
    constructing the volume voxel bundles adjacent to a surface corresponding to the one or more pore spaces.

7. The method of claim 6, wherein constructing the volume voxel bundles comprises:
    identifying one or more seed voxels;
    applying spherical radius for each of the one or more seed voxels based on a distance map;

applying an adjustment value to the spherical radius to obtain a search radius; and generating a volume voxel bundle based on at least the search radius.

8. The method of claim 7, wherein generating the volume voxel bundle comprises adding one or more target voxels to the volume voxel bundle, wherein the one or more target voxels are within the search radius and are not affiliated with another volume voxel bundle.

9. The method of claim 5, wherein decomposing the void space to represent the one or more pore spaces comprises:

decomposing the medial axis into a set of edges, wherein each of the set of edges represents a connection between at least one of endpoints of the medial axis or vertices of the medial axis;

classifying voxels that are not within the set of edges as part of a set of potential pore voxels;

traversing each of the set of edges; and generating a gradient of a distance map along the set of edges.

10. The method of claim 9, wherein decomposing the void space to represent the one or more pore spaces comprises:

generating the set of potential pore voxels using at least a set of local maxima;

generating a set of potential pore throat voxels using at least the set of local maxima;

generating the pore bodies and the pore throats bundles using at least the set of potential pore voxels and the set of potential pore throat voxels;

generating the volume voxel bundles from a set of voxels not assigned to the pore bodies or the pore throats bundles; and outputting an image graph comprising the pore bodies, the pore throats bundles, and the volume voxel bundles.

11. The method of claim 5, wherein clustering the one or more pore spaces comprises converting vertices of an image graph into a set of graph objects that represent a set of clustered voxel bundles, wherein converting comprises:

reclassifying at least some of the pore throats bundles and at least some of the pore bodies; and clustering at least two of the set of graph objects.

12. The method of claim 5, wherein at least one of the pore throats bundles comprises a connection between two pore bodies having spherical radii larger than or equal to the at least one of the pore throats bundles.

13. The method of claim 5, wherein generating the set of subnetworks based on the pore bodies and the pore throats bundles comprises:

inflating a subgraph based on the medial axis;

clustering neighboring objects within the subgraph, wherein the neighboring objects comprise at least some of the pore bodies and at least some of the pore throats bundles; and outputting an image graph comprising the pore bodies and the pore throats bundles.

14. The method of claim 5, wherein characterizing one or more properties of the set of subnetworks comprises:

generating a center and a spherical radius for each of the pore bodies;

generating a length for each of the pore throats bundles;

classifying each of the pore bodies, each of the pore throats bundles, or each of both according to a shape factor; and generating a volume for each of the pore bodies, each of the pore throats bundles, or each of both.

15. The method of claim 14, further comprising generating a clay content value for each of the pore bodies, each of the pore throats bundles, or each of both.

16. The method of claim 5, wherein clustering the one or more pore spaces is further based on an association of some of the one or more pore spaces to a set of clay bodies.

17. The method of claim 1, wherein obtaining a cohesive network representative of the porous media sample further comprises:

defining an overlap region for the set of subnetworks, based at least in part on the set of overlapping subimages;

based on the overlap region, decomposing the global image into a set of geometric shapes;

merging the subnetworks based on the set of overlap regions to generate a merged pore network;

populating the merged pore network with a set of pore bodies and a set of pore throats; and defining a set of inlet elements and a set of outlet elements within or ascribed to the set of pore bodies and the set of pore throats to generate the cohesive pore network.

18. The method of claim 1, further comprising removing redundant flow paths from the set of subnetworks.

19. A method for pore network extraction by one or more processing units, comprising:

obtaining a global image of a porous media sample;

decomposing the global image into a set of overlapping subimages, a set of pore labels, and a set of interfaces;

extracting a set of subnetworks corresponding to the set of overlapping subimages, comprising:

constructing, within a geometry, one or more medial axis bundles corresponding to one or more unclaimed voxels, the unclaimed voxels falling along a medial axis and being different than both one or more pore bodies and one or more pore throat bundles;

obtaining a cohesive pore network representing the porous media sample by merging the set of subnetworks; and outputting the cohesive pore network.

20. The method of claim 19, wherein extracting a set of subnetworks comprises:

constructing, within the geometry corresponding to the set of overlapping subimages, one or more pore bodies within voxels based on at least the set of pore labels;

constructing, within the geometry, one or more pore throat bundles based on at least the set of interfaces; and identifying, within the geometry, one or more seed voxels.

21. The method of claim 20, wherein the one or more medial axis bundles are reassigned to the one or more pore bodies, the one or more pore throats bundles, or some combination of the one or more pore bodies and the one or more pore throats bundles.

22. An apparatus, comprising: a memory comprising executable instructions, and one or more processors configured to execute the executable instructions and cause the apparatus to:

obtain a global image of a porous media sample;

decompose the global image into a set of overlapping subimages;

extract a set of subnetworks corresponding to the set of overlapping subimages, comprising:

identifying a set of voxels along a medial axis that lie within a void space, wherein the void space contains one or more pore spaces, wherein the one or more pore spaces comprise at least one of pore bodies, pore throats bundles, and volume voxel bundles; and generating the set of subnetworks based on the pore bodies and the pore throats bundles;

obtain a cohesive pore network representing the porous media sample by merging the set of subnetworks; and output the cohesive pore network.

23. A non-transitory computer-readable medium comprising executable instructions that, when executed by a processor of an apparatus, cause the apparatus to:

obtain a global image of a porous media sample;

decompose the global image into a set of overlapping subimages;

extract a set of subnetworks corresponding to the set of overlapping subimages, comprising:

identifying a set of voxels along a medial axis that lie within a void space, wherein the void space contains one or more pore spaces, wherein the one or more pore spaces comprise at least one of pore bodies, pore throats bundles, and volume voxel bundles; and generating the set of subnetworks based on the pore bodies and the pore throats bundles;

obtain a cohesive pore network representing the porous media sample by merging the set of subnetworks; and output the cohesive pore network.

24. An apparatus, comprising: a memory comprising executable instructions, and one or more processors configured to execute the executable instructions and cause the apparatus to:

obtain a global image of a porous media sample;

decompose the global image into a set of overlapping subimages, a set of pore labels, and a set of interfaces;

extract a set of subnetworks corresponding to the set of overlapping subimages, comprising:

constructing, within a geometry, one or more medial axis bundles corresponding to one or more unclaimed voxels, the unclaimed voxels falling along a medial axis and being different than both one or more pore bodies and one or more pore throat bundles;

obtain a cohesive pore network representing the porous media sample by merging the set of subnetworks; and output the cohesive pore network.

25. A non-transitory computer-readable medium comprising executable instructions that, when executed by a processor of an apparatus, cause the apparatus to:

obtain a global image of a porous media sample;

decompose the global image into a set of overlapping subimages, a set of pore labels, and a set of interfaces;

extract a set of subnetworks corresponding to the set of overlapping subimages, comprising:

constructing, within a geometry, one or more medial axis bundles corresponding to one or more unclaimed voxels, the unclaimed voxels falling along a medial axis and being different than both one or more pore bodies and one or more pore throat bundles;

obtain a cohesive pore network representing the porous media sample by merging the set of subnetworks; and output the cohesive pore network.

* * * * *